United States Patent
Kondo

(10) Patent No.: US 10,644,085 B2
(45) Date of Patent: *May 5, 2020

(54) SELF-LUMINOUS DISPLAY PANEL MANUFACTURING METHOD AND SELF-LUMINOUS DISPLAY PANEL

(71) Applicant: JOLED INC., Tokyo (JP)

(72) Inventor: Tetsuro Kondo, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/114,228

(22) Filed: Aug. 28, 2018

(65) Prior Publication Data

US 2019/0067395 A1    Feb. 28, 2019

(30) Foreign Application Priority Data

Aug. 28, 2017    (JP) ................................. 2017-163516

(51) Int. Cl.
   *G09G 3/3225*    (2016.01)
   *H01L 27/32*    (2006.01)
   (Continued)

(52) U.S. Cl.
   CPC ...... *H01L 27/3246* (2013.01); *H01L 27/3211* (2013.01); *H01L 51/0005* (2013.01);
   (Continued)

(58) Field of Classification Search
   CPC ............ H01L 27/3246; H01L 27/3211; H01L 51/0005; H01L 51/5012; H01L 51/5072;
   (Continued)

(56) References Cited

U.S. PATENT DOCUMENTS

2007/0200488 A1    8/2007  Ito
2009/0160322 A1*   6/2009  Yoshida .............. H01L 27/3246
                                                      313/504
(Continued)

FOREIGN PATENT DOCUMENTS

JP    2007-234232 A    9/2007
JP    2016-71992 A    5/2016
(Continued)

*Primary Examiner* — Lisa S Landis
(74) *Attorney, Agent, or Firm* — Hauptman Ham, LLP

(57) ABSTRACT

A method of manufacturing a self-luminous display panel, includes: preparing a substrate; forming banks above the substrate; detecting a bank having a defect portion; determining, with respect to the detected bank, only one of two adjacent spaces as a repair target space; forming a dam structure in the repair target space; and forming light-emitting layers. The banks are elongated and extend in a column direction, and are arranged in a row direction with spaces therebetween. The two adjacent spaces are each located between the detected bank and an adjacent bank. The dam structure is located within a predetermined distance from the defect portion, and at least partially surrounds the defect portion or is composed of a pair of dam elements disposed with the defect portion therebetween in the column direction. The light-emitting layers are formed by applying inks to the spaces between the banks. The inks contain self-luminous materials.

8 Claims, 17 Drawing Sheets

(51) Int. Cl.
*H01L 51/50* (2006.01)
*H01L 51/52* (2006.01)
*H01L 51/56* (2006.01)
*H01L 51/00* (2006.01)

(52) U.S. Cl.
CPC ...... *H01L 51/5012* (2013.01); *H01L 51/5072* (2013.01); *H01L 51/5092* (2013.01); *H01L 51/5218* (2013.01); *H01L 51/5234* (2013.01); *H01L 51/5246* (2013.01); *H01L 51/56* (2013.01); *G09G 3/3225* (2013.01); *H01L 27/3283* (2013.01); *H01L 2251/568* (2013.01)

(58) Field of Classification Search
CPC ............. H01L 51/5092; H01L 51/5218; H01L 51/5234; H01L 51/5246; H01L 51/56; G09G 3/3225

See application file for complete search history.

(56) References Cited

U.S. PATENT DOCUMENTS

| | | | |
|---|---|---|---|
| 2011/0287682 A1* | 11/2011 | Miyazawa | H01L 27/3246 445/2 |
| 2013/0328035 A1 | 12/2013 | Okumoto et al. | |
| 2014/0042417 A1 | 2/2014 | Okumoto et al. | |
| 2014/0042419 A1 | 2/2014 | Okumoto et al. | |
| 2017/0012246 A1* | 1/2017 | Onimaru | H01L 27/3246 |
| 2017/0040393 A1* | 2/2017 | Onimaru | H01L 27/3246 |
| 2017/0077460 A1* | 3/2017 | Hayashida | H01L 51/56 |
| 2017/0117339 A1* | 4/2017 | Takata | H01L 51/50 |
| 2017/0170244 A1* | 6/2017 | Kobayashi | H01L 27/3283 |
| 2017/0301889 A1* | 10/2017 | Hayashida | H01L 27/3246 |

FOREIGN PATENT DOCUMENTS

| | | |
|---|---|---|
| JP | 2017-33813 A | 2/2017 |
| WO | 2012/176231 A1 | 12/2012 |
| WO | 2012/176232 A1 | 12/2012 |
| WO | 2013/073087 A1 | 5/2013 |
| WO | 2015/118882 A1 | 8/2015 |
| WO | 2015/118883 A1 | 8/2015 |
| WO | 2015/133090 A1 | 9/2015 |

* cited by examiner

Bank repair

Firing

Ink application

Drying

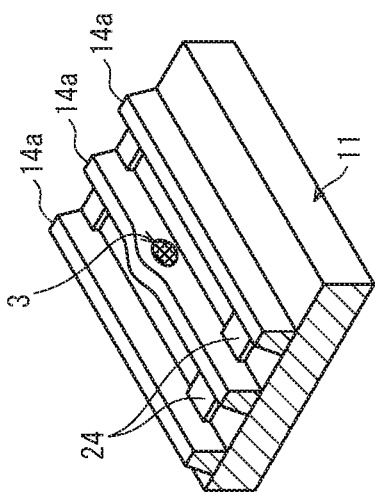
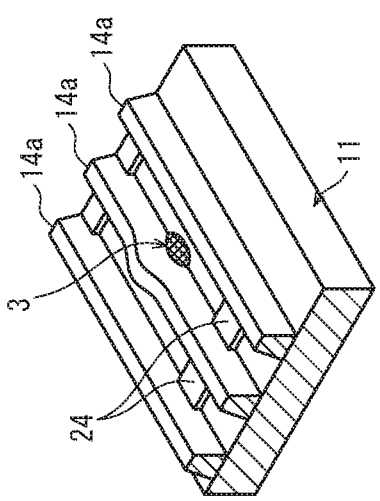
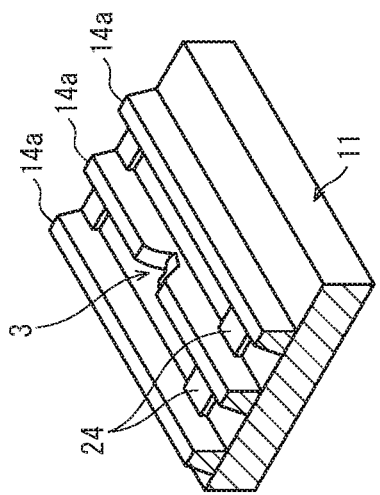

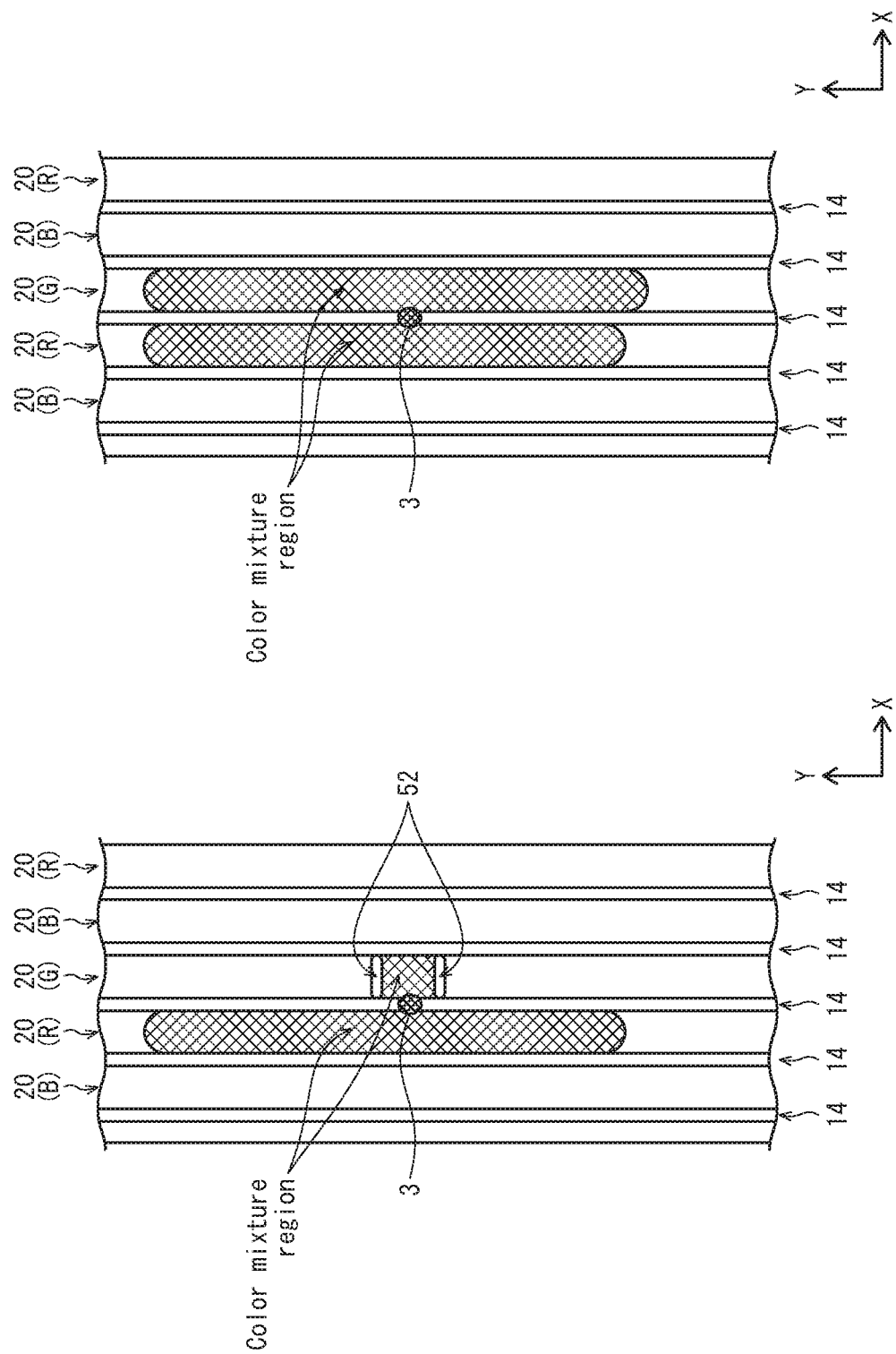

SELF-LUMINOUS DISPLAY PANEL MANUFACTURING METHOD AND SELF-LUMINOUS DISPLAY PANEL

This application claims priority to Japanese Patent Application No. 2017-163516 filed Aug. 28, 2017, the contents of which are hereby incorporated by reference in their entirety.

BACKGROUND

Technical Field

The present disclosure relates to a self-luminous display panel manufacturing method and a self-luminous display panel.

Description of Related Art

In recent years, organic EL display panels including a matrix of organic EL elements arranged above a substrate have been put into practical use, as one type of a self-luminous display device. Such organic EL display panels achieve high visibility due to the organic EL elements being self-luminous. Also, such organic EL display panels achieve excellent shock resistance due to the organic EL elements being completely solid-state elements.

Organic EL elements in a typical organic EL display panel have a basic structure in which a light-emitting layer containing an organic light-emitting material is disposed between an electrode pair composed of an anode and a cathode. The organic EL elements are driven through voltage application between these electrodes. The organic EL elements are current-driven light-emitting elements, emitting light when holes injected into the light-emitting layer from the anode and electrons injected into the light-emitting layer from the cathode recombine in the light-emitting layer.

In a typical organic EL display panel, a light-emitting layer of one organic EL element is partitioned from a light-emitting layer of an adjacent organic EL element by a bank formed by using an electrically-insulative material.

Further, in an organic EL element of a typical organic EL display panel, one or more organic layers, such as a hole injection layer, a hole transport layer, and a hole injection/transport layer, are disposed as necessary between the anode and the light-emitting layer. Likewise, one or more organic layers, such as an electron injection layer, an electron transport layer, and an electron injection/transport layer are disposed as necessary between the cathode and the light-emitting layer.

These organic layers, as well as the light-emitting layer, are commonly referred to as functional layers.

In a full-color organic EL display panel, a plurality of organic EL elements having a structure as described above are disposed, and each organic EL element serves as a red sub-pixel, a green sub-pixel, or a blue sub-pixel. Further, each pixel of a full-color organic EL display panel is composed of a set of red, green, and blue sub-pixels disposed next to one another.

The manufacturing of such an organic EL display panel involves a process of forming one or more organic functional layers, including the light-emitting layer, in spaces defined by banks, after forming the banks on the substrate. The forming of the organic functional layers is often performed through a wet process of applying, to the spaces, an ink containing a macro-molecular material or a low-molecular material suitable for forming a thin film, through an inkjet method or a similar method. Such a wet process enables organic functional layers to be formed relatively easily, even in large panels.

SUMMARY

A method pertaining to at least one aspect of the present disclosure is a method of manufacturing a self-luminous display panel. The method includes: preparing a substrate; forming banks above the substrate; detecting a bank having a defect portion among the banks; determining, with respect to the detected bank having the defect portion, only one of two adjacent spaces as a repair target space; forming a dam structure in the repair target space; and forming light-emitting layers. The banks are each elongated and each extend in a column direction, and are arranged in a row direction with spaces therebetween. The two adjacent spaces are each located between the detected bank and a bank adjacent to the detected bank in the row direction. The dam structure is located within a predetermined distance from the defect portion. The dam structure at least partially surrounds the defect portion, or is composed of a pair of dam elements disposed with the defect portion therebetween in the column direction. The light-emitting layers are formed by applying inks to the spaces between the banks. The inks contain self-luminous materials.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 8A is a schematic perspective view illustrating an example of a bank defect portion produced by a foreign particle pertaining to at least one embodiment, FIG. 8B is a schematic perspective view illustrating another example of a bank defect portion produced by a foreign particle pertaining to at least one embodiment, and FIG. 8C is a schematic perspective view illustrating one example of a bank defect portion produced by a bank collapsing pertaining to at least one embodiment.

FIG. 12A is a schematic plan view illustrating a state where ink layers have been formed, after a dam structure has been formed pertaining to at least one embodiment, and FIG. 12B is a schematic plan view illustrating a comparative example where no dam structure has been formed pertaining to at least one embodiment.

DETAILED DESCRIPTION

Figure 1:
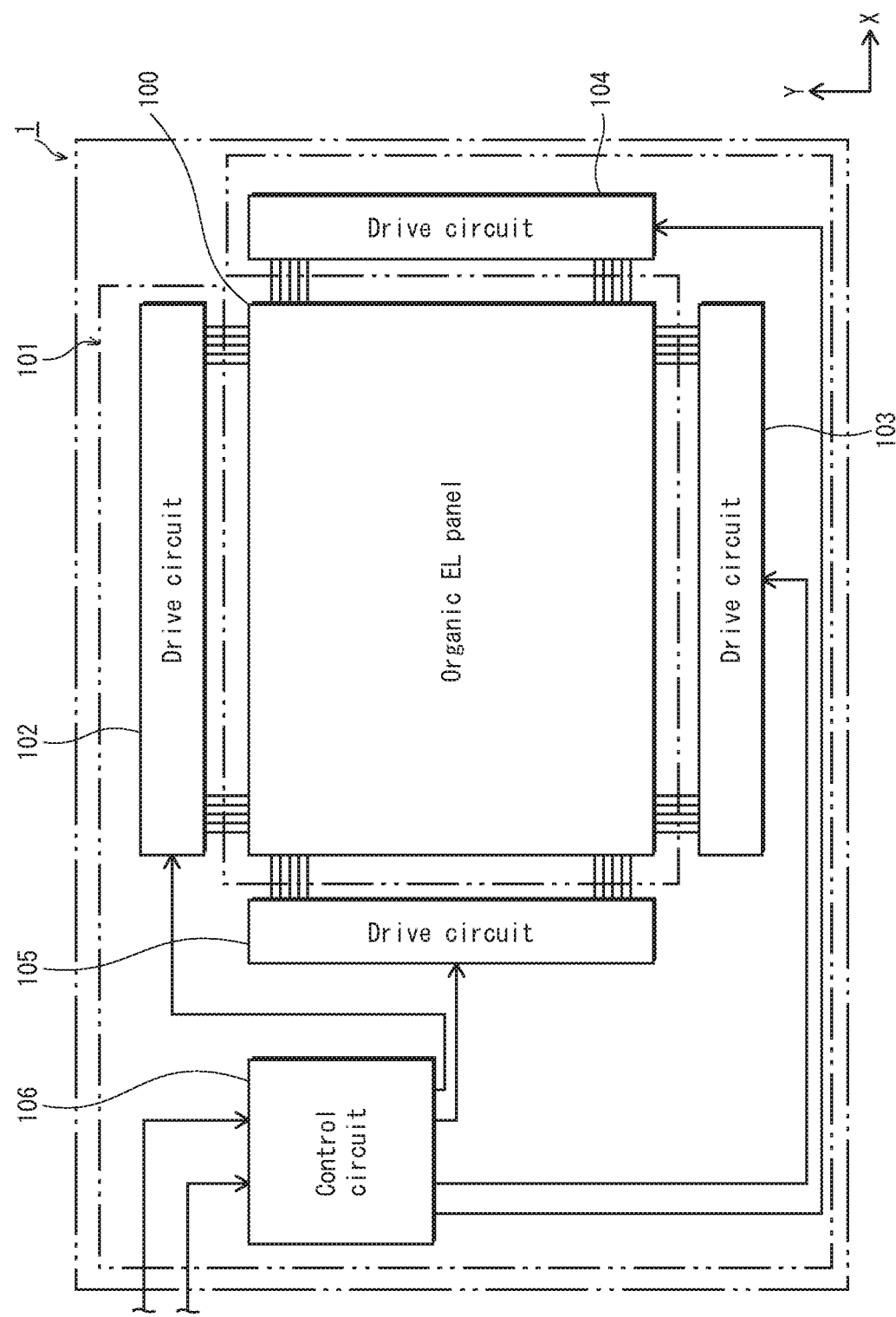
FIG. 1 is a schematic block diagram illustrating the structure of an organic EL display device pertaining to at least one embodiment.

Process by which the Present Disclosure was Achieved

According to a manufacturing method of an organic EL display panel having the line bank structure, and banks, which are each elongated and each extend in a column direction, are formed above a substrate with spaces therebetween in a row direction, and light-emitting layers are formed by applying inks containing organic light-emitting materials to the spaces between the banks. The inks can flow within the spaces along the banks owing to the line bank structure, and this uniformizes film thickness which is ununiform at ink application. As a result, light-emitting layers having uniform film thickness can be formed. This yields an organic EL display panel with a reduced luminance unevenness. However, there is a possibility that when a bank has a defect portion, an ink, which is applied to one of two adjacent spaces that are each located between the bank having the defect portion and an adjacent bank, flows into the other space via the defect portion, and thus a color mixture region is produced in the other space due to inks of different light-emission colors mixing. Especially according to the line bank structure, a display element failure might occur over pixels due to the flow of mixed inks of different light-emission colors along banks.

One way to repair defect portions of banks having the line bank structure is for example a technique described in Japanese Patent Application Publication No. 2017-33813 according to which a dam structure at least partially surrounding a defect portion is formed in each of two adjacent spaces that are each located between a bank having the defect portion and an adjacent bank, thereby to prevent occurrence of a display element failure.

It can be expected that owing to formation of a dam structure at least partially surrounding a defect portion in each of two adjacent spaces that are each located between a bank having the defect portion and an adjacent bank, it is possible to prevent a color mixture region, where inks of different light-emission colors mix with one another, from spreading beyond the dam structure, thereby to reduce occurrence of a display element failure caused by light-emission in an undesired color. Unfortunately, formation of a dam structure might cause occurrence of a display element failure in which light is abnormally emitted from a subpixel where the dam structure has been formed. In other words, if a dam structure is formed in each of two adjacent subpixels that are each located between a bank having a defect portion and an adjacent bank, a display element failure might occur in each of the both two adjacent subpixels in which the dam structures have been formed.

Here, according to the specifications required for display devices, it may be permissible that a display element failure occurs in each of an extremely small number of isolated and discontinuous subpixels. Meanwhile, it may be impermissible that a display element failure occurs in each of two continuous subpixels.

In view of this, if a dam structure is formed in each of two adjacent spaces that are each located between a bank having a defect portion and an adjacent bank, the specifications required for display devices might be satisfied.

Here, even if a color mixture region is produced in a space, change in light-emission color in the color mixture region from the originally specified color is sometimes confined to a negligible degree as long as an extremely small amount of an ink of a different light-emission color flows into an adjacent space via the defect portion. Accordingly, it may be unnecessary to form such a dam structure at least partially surrounding a defect portion as long as an amount of an ink of a different light-emission color flowing into the space via the defect portion is confined to extremely small On the other hand, by forming a dam structure in a space adjacent to a bank having a defect portion such that the dam structure at least partially surrounds the defect portion, an ink applied inside a region defined by the dam structure in the space can be prevented from spreading beyond the dam structure, and an ink applied outside the range can be prevented from flowing into the range. This confines an ink flowing from the space into an adjacent space via the defect portion to at most an amount applied inside the region defined by the dam structure.

In view of this, by forming a dam structure at least partially surrounding a defect portion in only one of two adjacent spaces that are each located between a bank having the defect portion and an adjacent bank, an amount of an ink, which flows from the one space in which the dam structure has been formed into the other space in which no dam structure has been formed, can be confined. Owing to this structure, if a color mixture occurs in the other space in which no dam structure has been formed, the color mixture only exercises an effect to an almost negligible degree, and thus no display element failure occurs in any subpixel in the other space. It is true that a display element failure might occur in a subpixel corresponding to the dam structure, but no display element failure occurs in any subpixel in the other space adjacent to the one space with the defect portion therebetween. This confines occurrence of a display element failure to only the isolated subpixel corresponding to the one space in which the dam structure has been formed.

Through the above process, the present inventor arrived at the present disclosure according to which occurrence of a display element failure caused by a bank defect portion is confined to each isolated subpixel.

As described above, for a full-color organic EL display panel, inks corresponding to different colors of light are applied to adjacent spaces partitioned by a bank. Here, if the bank between the adjacent spaces has a defect portion having been produced in the manufacturing process of the organic EL display panel, ink applied to one space may leak into the adjacent space via the defect portion in the process of forming light-emitting layers. This results in color mixture in which inks corresponding to different light-emission colors mixing with one another. Note that in the present disclosure, it is considered that a bank defect portion is produced when, for example, a portion of a bank collapses or a foreign particle adheres to a bank in the manufacturing process of the organic EL display panel.

When an organic EL display device is manufactured using a panel in which such color mixture has occurred, display element failures may appear in the manufactured organic EL display device. That is, for example, the region of the organic EL display device where color mixture has occurred may emit light with an undesired color, or may be perceived as a dark spot.

In view of this, there is a demand for a technology of repairing banks having defect portions and thereby preventing such display element failures from occurring in display panels.

The present disclosure includes a self-luminous display panel manufacturing method and a self-luminous display panel that prevent display element failures from occurring even if a bank defect portion is produced in the manufacturing process of the self-luminous display panel.

Overview

A method pertaining to at least one aspect of the present disclosure is a method of manufacturing a self-luminous display panel. The method includes: preparing a substrate; forming banks above the substrate; detecting a bank having a defect portion among the banks; determining, with respect to the detected bank having the defect portion, only one of two adjacent spaces as a repair target space; forming a dam structure in the repair target space; and forming light-emitting layers. The banks are each elongated and each extend in a column direction, and are arranged in a row direction with spaces therebetween. The two adjacent spaces are each located between the detected bank and a bank adjacent to the detected bank in the row direction. The dam structure is located within a predetermined distance from the defect portion. The dam structure at least partially surrounds the defect portion, or is composed of a pair of dam elements disposed with the defect portion therebetween in the column direction. The light-emitting layers are formed by applying inks to the spaces between the banks. The inks contain self-luminous materials.

The following describes at least one embodiment of a display panel as at least one aspect of the present disclosure with reference to the drawings.

Embodiments

[Overall Structure of Organic EL Display Device]

FIG. 1 is a schematic block diagram illustrating the structure of an organic EL display device 1 having a display panel 100 pertaining to at least one embodiment.

In FIG. 1, the organic EL display device 1 includes the display panel 100 and a drive controller 101 connected thereto. The display panel 100 is a panel using the electroluminescence effect of an organic material. In the display panel 100, light-emitting elements (organic EL elements) 10 are arranged above a substrate to form a matrix in FIG. 2. The drive controller 101 includes four drive circuits, namely drive circuits 102, 103, 104, and 105, and a control circuit 106.

The arrangement of the drive controller 101 with respect to the display panel 100 is not limited to that illustrated in FIG. 1.

[Structure of Organic EL Display Panel]

Figure 2:
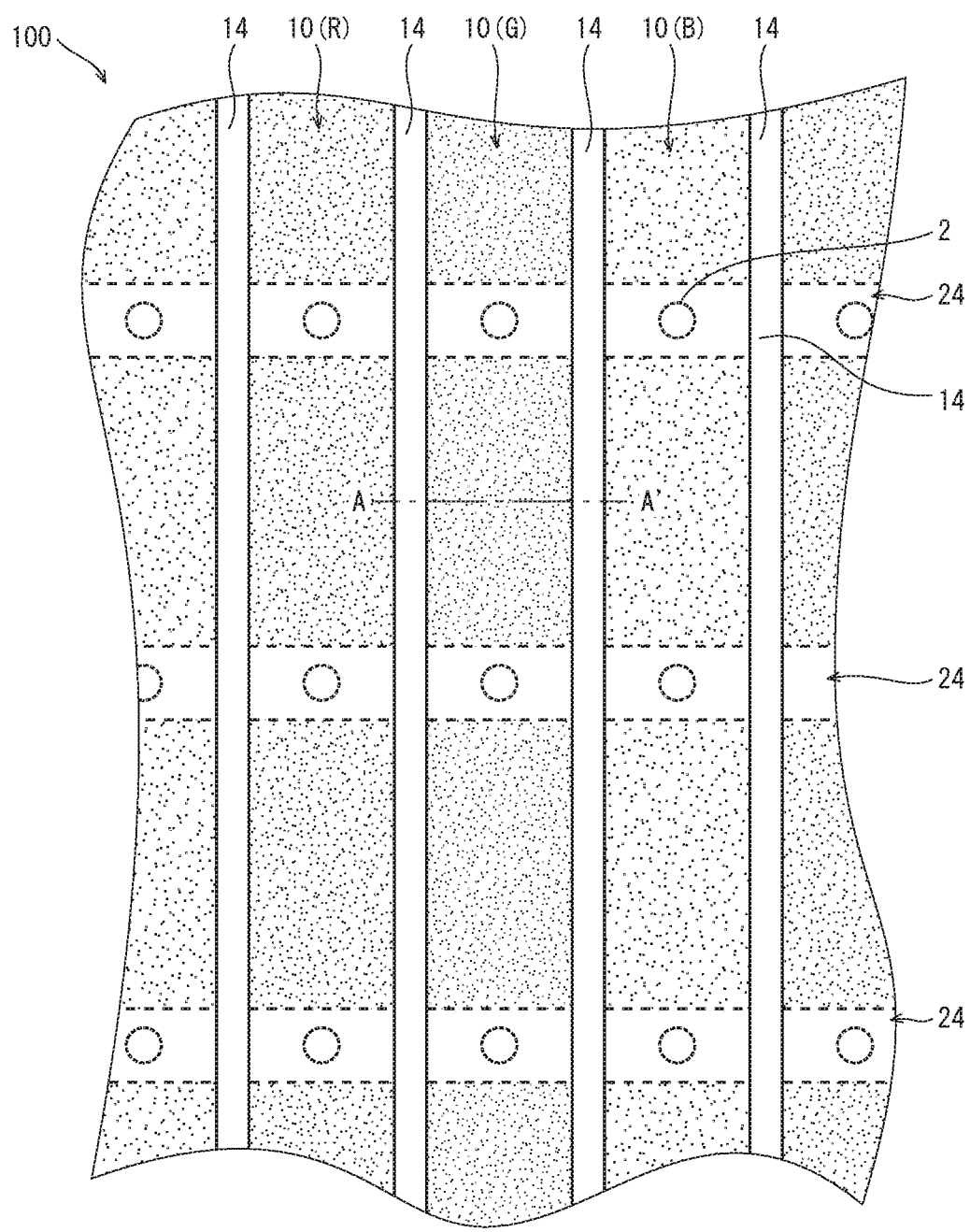
FIG. 2 is a schematic plan view illustrating a part of a display panel pertaining to at least one embodiment.
Figure 3:
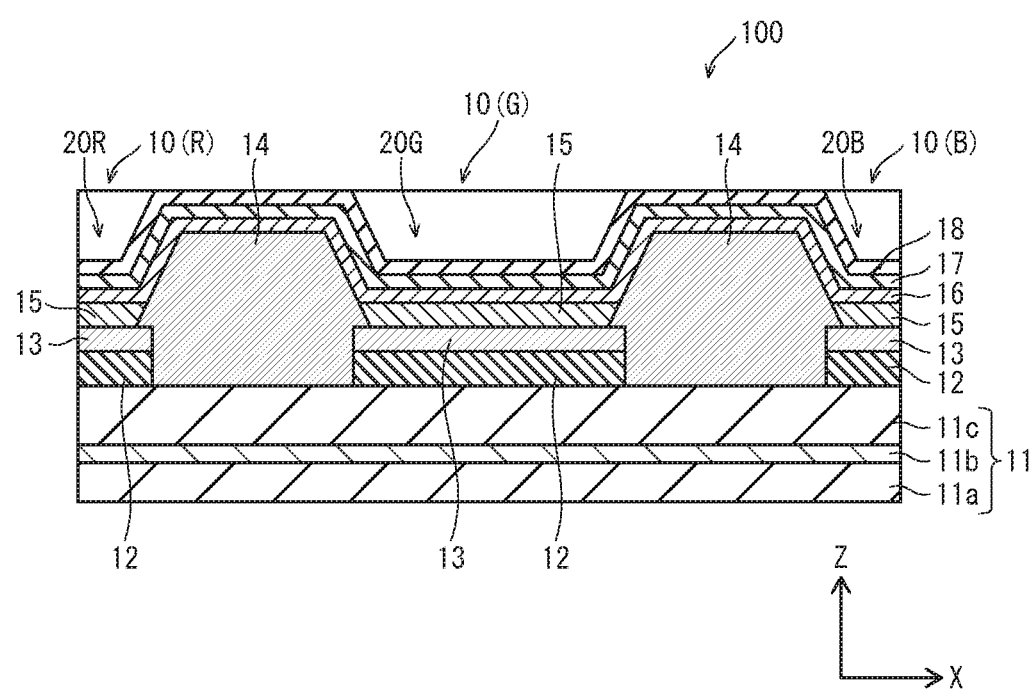
FIG. 3 is a cross-sectional view illustrating a part of the display panel pertaining to at least one embodiment, taken along line A-A' of FIG. 2, in magnified state.

FIG. 2 is a schematic plan view illustrating the overall structure of the display panel 100 pertaining to at least one embodiment, when viewed in plan from above a display surface thereof. FIG. 3 is a cross-sectional view illustrating a part of the display panel 100 pertaining to at least one embodiment, taken along line A-A' of FIG. 2, in magnified state. The display panel 100 is a so-called top-emission-type panel, and the display surface of the display panel 100 is located in the Z direction in FIG. 3.

The following describes the structure of the display panel 100, with reference to FIG. 2 and FIG. 3.

In FIG. 3, the display panel 100 includes, as main components thereof, a ground substrate 11, pixel electrodes 12, a hole injection layer 13, first banks 14, organic light-emitting layers 15, an electron transport layer 16, a common electrode 17, and a sealing layer 18.

The hole injection layer 13, the organic light-emitting layers 15, and the electron transport layer 16 are functional layers, and thus, the functional layers are disposed between the pixel electrodes 12 and the common electrode 17.

Each light-emitting element 10 includes an organic light-emitting layer 15 of a corresponding light-emission color. That is, the light-emitting elements 10R, 10G, and 10B include organic light-emitting layers 15 of the colors red (R), green (G), and blue (B), respectively. Each light-emitting element 10 serves as a sub-pixel of the display panel 100, and sub-pixels are arranged to form a matrix in the display panel 100 in FIG. 2.

FIG. 2 illustrates a state where the electron transport layer 16, the common electrode 17, and the sealing layer 18 are removed.

[Ground Substrate]

The ground substrate 11 includes a substrate body 11*a*, thin-film transistor (TFT) layers 11*b*, and an interlayer insulation layer 11*c*.

The substrate body 11*a* serves as the base of the display panel 100, and may be formed by using, for example, an electrically-insulating material such as non-alkali glass, soda glass, polycarbonate resin, polyester resin, or aluminum oxide. Alternatively, the substrate body 11*a* may be formed by using a polyimide material.

The TFT layers 11*b* are provided one-to-one for sub-pixels of the display panel 100, on the surface of the substrate body 11*a*. Each TFT layer 11*b* has formed therein a pixel circuit that includes a TFT element.

The interlayer insulation layer 11*c* is formed on the TFT layers 11*b*. The interlayer insulation layer 11*c* is formed by using an organic electrically-insulating material such as a polyimide resin, an acrylic resin, or a novolac-type phenol resin, or an inorganic electrically-insulating material such as SiO (silicon oxide) or SiN (silicon nitride). The interlayer insulation layer 11*c* secures electrical insulation between the TFT layers 11*b* and the pixel electrodes 12. In addition, the interlayer insulation layer 11*c* planarizes any level difference on the top surfaces of the TFT layers 11*b*, and thereby suppresses the influence that such level differences would otherwise have with respect to the surface on which the pixel electrodes 12 are formed.

Pixel Electrodes

The pixel electrodes 12 are provided one-to-one for sub-pixels of the display panel 100, on the ground substrate 11. The pixel electrodes 12 are formed by using an optically-reflective electrically-conductive material, such as Ag (silver), Al (aluminum), aluminum alloy, Mo (molybdenum), or APC (an alloy of silver, palladium, and copper). According to at least one embodiment, the pixel electrodes 12 serve as anodes.

A conventional light-transmissive electrically-conductive film may be additionally provided on the surface of each pixel electrode 12. This light-transmissive electrically-conductive film may be formed by using, for example, indium tin oxide (ITO) or indium zinc oxide (IZO). The light-transmissive electrically-conductive films are disposed between the pixel electrodes 12 and the hole injection layer 13, and improve inter-layer joining.

Hole Injection Layer

The hole injection layer 13 is formed, for example, by using an oxide of a metal such as silver (Ag), molybdenum (Mo), chromium (Cr), vanadium (V), tungsten (W), nickel (Ni), or iridium (Ir), or an electrically-conductive polymer material such as PEDOT (a mixture of polythiophene and polystyrene sulfate). The hole injection layer 13, when formed by using a metal oxide, assists hole generation and ensures stable injection and transportation of holes to the organic light-emitting layers 15.

Banks

A plurality of linear first banks 14 are provided on the surface of the hole injection layer 13. In plan view, each of the first banks 14 is elongated and extends in the Y direction, and has a rectangular shape. The first banks 14 are formed by using an organic electrically-insulative material (for example, an acrylic resin, a polyimide resin, or a novolac-type phenol resin).

In FIG. 3, each of the first banks 14 has a trapezoidal cross-section. Further, a pair of first banks 14 defines a space 20, whereby a plurality of spaces 20 (spaces 20R, 20G, 20B) are partitioned from one another by the first banks 14. At the bottom portion of each space 20, a plurality of pixel electrodes 12 are arranged along the Y direction, and above the pixel electrodes 12, functional layers are disposed. The functional layers include the hole injection layer 13, the organic light-emitting layers 15, and the electron transport layers 16.

The first banks 14 partition light-emitting elements 10 that are adjacent in the X direction from one another, and also serve as structural members that, when a wet process is performed for forming the organic light-emitting layers 15, prevent applied ink from overflowing.

In FIG. 2, the display panel 100 also includes a plurality of second banks 24. The second banks 24 have smaller height than the first banks 14 in FIG. 7. Further, a plurality of second banks 24 are disposed in each space 20 between pixel electrodes 12 that are adjacent in the Y direction. The second banks 24 partition light-emitting elements 10 that are adjacent in the Y direction from one another. As such, the display panel 100 is an organic EL display panel that has the so-called line bank structure.

The second banks 24 are disposed at the same Y-direction positions in every space 20. Each second bank 24 connects with adjacent second banks 24 by extending in the X direction below first banks 14, and thus, when viewed as a whole, each second bank 24 has a rectangular shape elongated in the X direction. Accordingly, the first banks 14 and the second banks 24 form a lattice structure over the ground substrate 11 in FIG. 2.

Organic Light-Emitting Layers

The organic light-emitting layers 15 emit light through recombination of carriers (i.e., holes and electrons) occurring therein, and each contain an organic material corresponding to one of the colors R, G, and B.

The organic light-emitting layers 15 are disposed in the spaces 20 (refer to the spaces 20R, 20G, and 20B illustrated in FIG. 7A and FIG. 7B), which are partitioned from one another by the first banks 14, are elongated and extend in the Y direction, and have groove-like shapes.

Figure 7A:
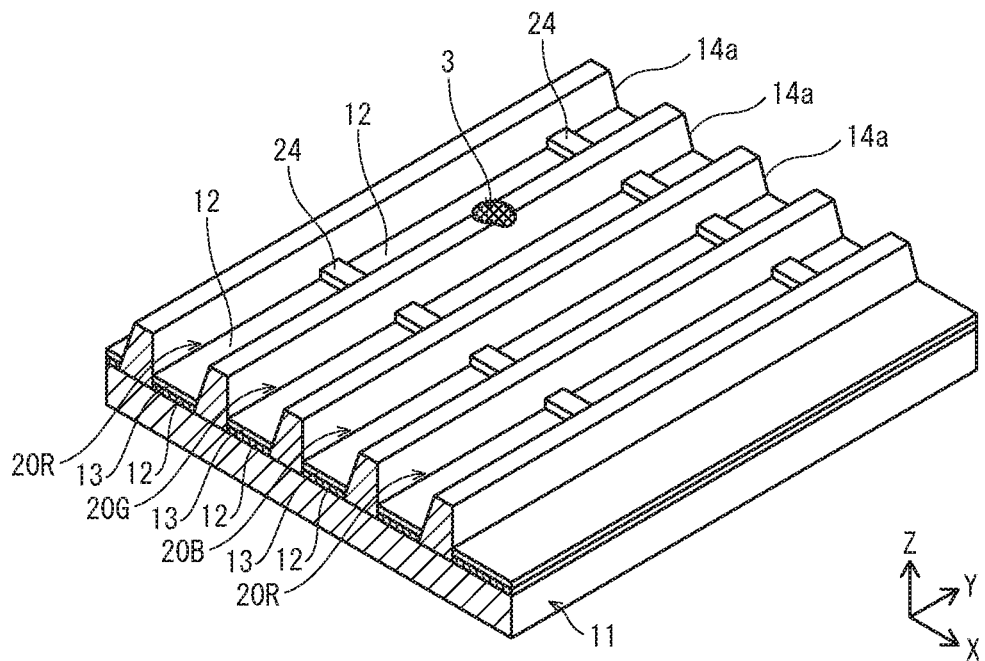
FIG. 7A is a schematic perspective view illustrating one example of a bank defect portion pertaining to at least one embodiment.
Figure 7B:
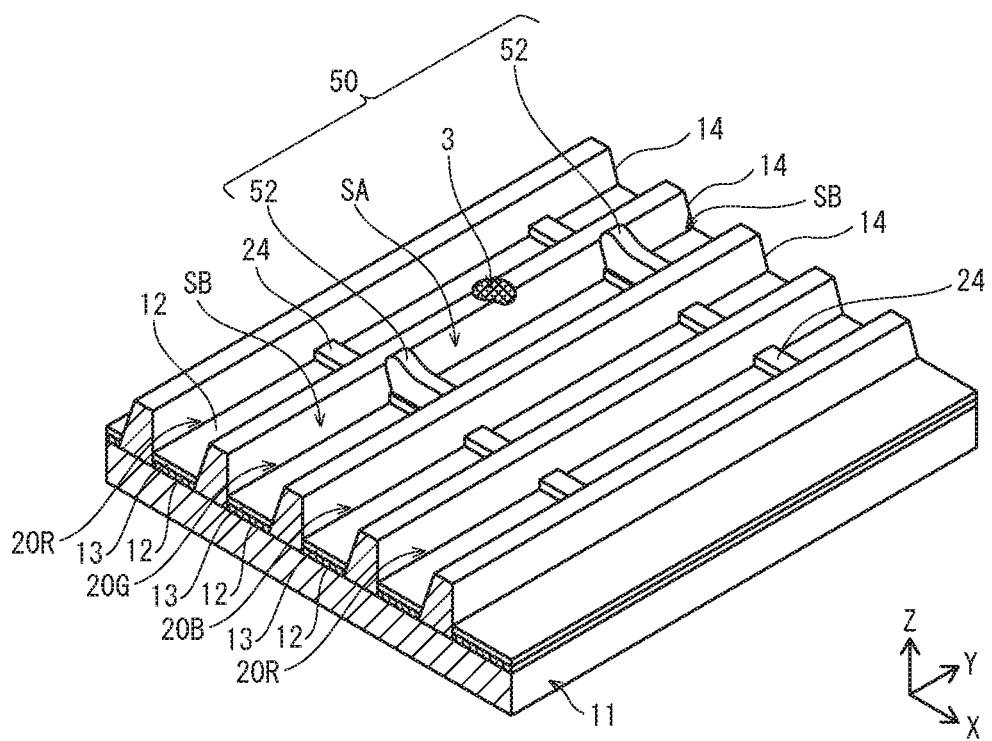
FIG. 7B is a schematic perspective view illustrating a state where a dam structure has been formed around the bank defect portion pertaining to at least one embodiment.

In FIG. 7A and FIG. 7B, each space 20R is a space in which light-emitting layers of the color R will be formed and thus, light-emitting elements 10R corresponding to the color R will be formed. Similarly, each space 20G is a space in which light-emitting layers of the color G will be formed and thus, light-emitting elements 10G corresponding to the color G will be formed, and each space 20B is a space in which light-emitting layers of the color B will be formed and thus, light-emitting elements 10B corresponding to the color B will be formed.

As such, each first bank 14 is disposed between two of organic light-emitting layers 15, which differ in terms of color.

The organic light-emitting layers 15 may be formed by using, for example, a fluorescent substance such as polyphenylene vinylene (PPV), polyfluorene, oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

[Electron Transport Layer]

The electron transport layer 16 transports electrons injected thereto from the common electrode 17 to the organic light-emitting layers 15, and is formed by using, for example, an oxidiazole derivative (OXD), a triazole derivative (TAZ), or a phenanthroline derivative (BCP, Bphen).

Common Electrode

The common electrode 17 is formed by using, for example, a light-transmissive material having electrically-conductive properties, such as ITO or IZO. The common electrode 17 extends across all sub-pixels of the display panel 100.

According to at least one embodiment, the common electrode 17 serves as a cathode.

[Sealing Layer]

The sealing layer 18 is disposed to protect the hole injection layer 13, the organic light-emitting layers 15, the electron transport layer 16, and the common electrode 17 from water and oxygen.

Although not depicted in the drawings, black matrices, color filters, and/or the like may also be formed above the sealing layer 18.

[Display Panel Manufacturing Method]

Figure 4:
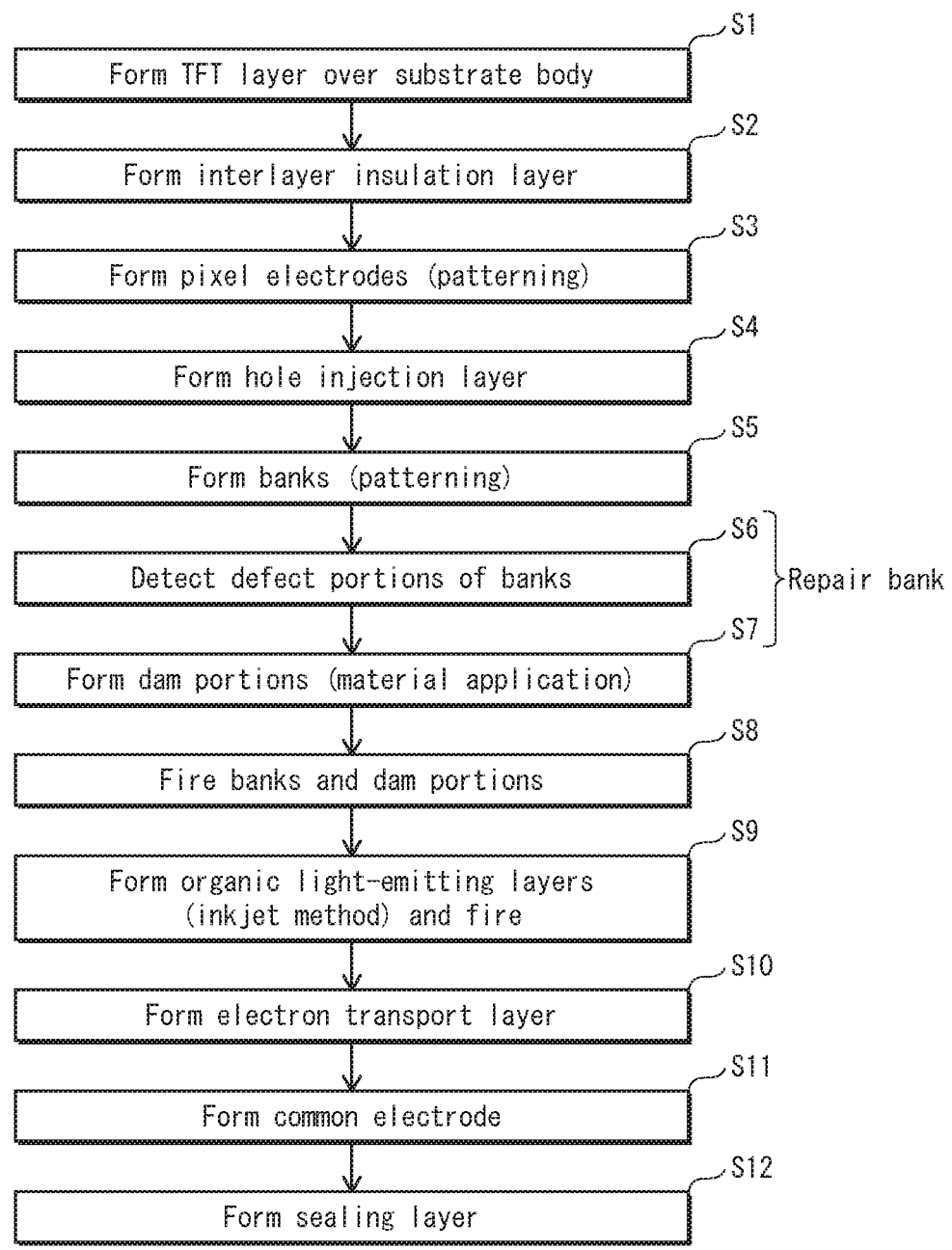
FIG. 4 is a schematic diagram illustrating a manufacturing process of the display panel pertaining to at least one embodiment.

FIG. 4 is a schematic diagram illustrating a manufacturing process of the display panel 100 pertaining to at least one embodiment.

FIG. 5A through FIG. 5E are schematic cross-sectional views each illustrating a procedure of the manufacturing process of the display panel 100 pertaining to at least one embodiment.

The manufacturing method of the display panel 100 is described in accordance with FIG. 4, which illustrates the procedures involved in the manufacturing process, and with further reference to FIG. 3 and FIG. 5A through FIG. 5E.

First, the TFT layers 11b are formed on the substrate body 11a (Step S1).

Subsequently, the interlayer insulation layer 11c is formed on the TFT layers 11b by using an organic material providing excellent electrical insulation and through a photoresist method, with which the preparation of the ground substrate 11 is completed (step S2). The thickness of the interlayer insulation layer 11c is approximately 4 μm, for example. Although not depicted in the cross-sectional view of FIG. 3 nor in FIG. 4, which illustrates the procedures involved in the manufacturing process, contact holes 2 (see FIG. 2) are also formed during the forming of the interlayer insulation layer 11c.

Next, the pixel electrodes 12 are formed, one for each sub-pixel, from a metallic material having a thickness of approximately 400 nm, through vacuum vapor deposition or sputtering (Step S3).

Then, the hole injection layer 13 is formed by uniformly forming a film of tungsten oxide above the ground substrate 11 and the pixel electrodes 12 through sputtering or the like (Step S4).

Subsequently, the first banks 14 and the second banks 24 are formed through photolithography (Step S5), as described in the following.

First, bank material (e.g., a photosensitive photoresist material) for forming the second banks 24 is applied uniformly above the hole injection layer 13.

Then, a photomask having openings matching the pattern of the second banks 24 is placed over the layer of the applied bank material, and developing is performed through UV irradiation. Subsequently, an unhardened and excess portion is removed from the bank material by using a developing fluid, thereby to form unfired second banks 24a. Then, the unfired second banks 24a are heated and fired. This completes the second bank 24.

Subsequently, bank material (e.g., a negative photosensitive resin composition) for forming the first banks 14 is applied uniformly above the substrate above which the second banks 24 have been formed.

Then, bank patterning is performed by placing a mask having openings matching the pattern of the first banks 14 over the layer of the applied bank material, and performing irradiation with light from above the mask. The pattern of the first banks 14 is completed by washing away an excess portion from the bank material with an alkaline developing fluid thereby to pattern the bank material.

Figure 5A:
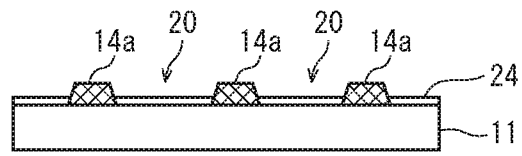
FIG. 5A through FIG. 5E are schematic cross-sectional views each illustrating a procedure of the manufacturing process of the display panel pertaining to at least one embodiment.

Unfired first banks 14a are formed as a result of such patterning, after the second banks 24 have been formed, in FIG. 5A. At this point, a space 20 has already been formed between each pair of adjacent unfired first banks 14a.

Next, the unfired first banks 14a, formed through the above-described patterning, are examined to detect defect portions (Step S6). Any defect portion detected is repaired.

Figure 5B:
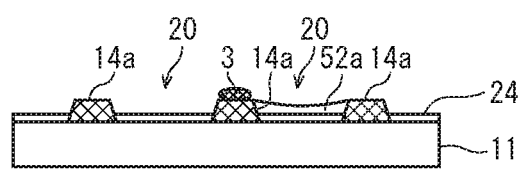

The bank repair is described in more detail later. Broadly speaking, a defect portion of an unfired first bank 14a is repaired by forming a dam structure, in the vicinity of the defect portion, in one of two adjacent spaces 20 that are each located between the unfired first bank 14a having the defect portion and an adjacent unfired first bank 14a (Step S7). The dam structure is formed by applying a repair material to the one space and then drying the applied repair material. FIG. 5B illustrates a state where unfired dam elements 52a have been formed by applying a repair material to one of two adjacent spaces 20 that are each located between an unfired first bank 14a having a defect portion and an adjacent unfired first bank 14a.

Then, first banks 14 and dam elements 52 are respectively produced by thermal firing of the unfired first banks 14a and the unfired dam elements 52a, thereby completing the repair of the defect portion 3 (Step S8). The firing is, for example, performed by heating the unfired first banks 14a and the unfired dam elements 52a at a temperature between 150° C. and 210° C. for 60 minutes.

Figure 5C:
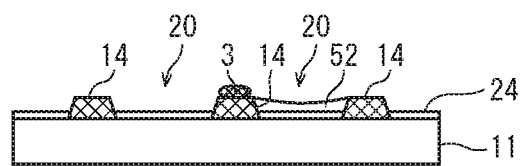

FIG. 5C illustrates a state where the dam elements 52, as well as the first banks 14, have been formed by this firing, or in other words, a state where any defect portion 3 of the first banks 14 has been repaired.

The first banks 14 formed in this manner may be further subjected to a process of adjusting contact angle with respect to ink to be applied in the subsequent procedure. Alternatively, in order to provide liquid repellency to the surfaces of the first banks 14, processing such as surface processing using a predetermined alkaline solution, water, an organic solvent, etc., or plasma processing may be performed. Note that, in order to provide liquid repellency to the first banks 14, the bank material for forming the first banks 14 may be liquid-repellent.

Although the unfired first banks 14 and the unfired dam structures 50 are simultaneously fired in this example, the first banks 14 and the dam structures 50 may be separately fired. In other words, the first banks 14 and the dam structures 50 may be formed as follows. Specifically, in this example, formation of the unfired first banks 14, detection of the defect portions 3, formation of the unfired dam structures 50, and firing of the unfired first banks 14 and the unfired dam structures 50 are performed in the stated order. Alternatively, these processes may be performed in the following order of formation of the unfired first banks 14, firing of the unfired first banks 14, detection of the defect portions 3, formation of the unfired dam structures 50, and firing of the unfired dam structures 50.

Figure 5D:
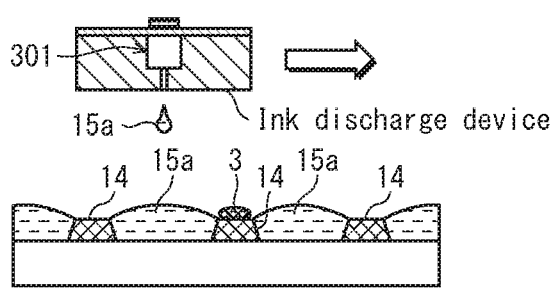
Figure 5E:
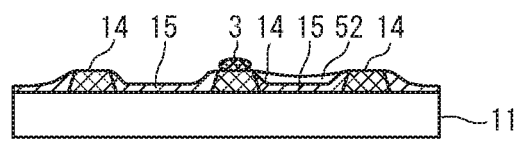

Next, inks for forming the organic light-emitting layers 15 are applied to the spaces 20 in FIG. 5D. Each ink is a mixture of an organic material for the corresponding organic light-emitting layers 15 and a solvent, and is applied to the inside of spaces 20 using an inkjet method. The details are described later on a method of applying inks to the inside of the spaces 20 using the inkjet method.

Ink layers 15a formed through the ink application are then dried by evaporating the solvent contained in the ink layers 15a, and thermal firing is performed when necessary. Thus, the organic light-emitting layers 15 are formed in the spaces 20 in FIG. 5E (Step S9).

Next, the electron transport layer 16 is formed above the organic light-emitting layers 15 and the first banks 14 by depositing a film of a material for the electron transport layer 16 through vacuum vapor deposition (Step S10).

The common electrode 17 is then formed by depositing a film of a material such as ITO or IZO through sputtering or the like (Step S11).

Then, the sealing layer 18 is formed by depositing a film of a light-transmissive material such as SiN or SiON on the surface of the common electrode 17 through sputtering, CVD, or the like (Step S12).

The manufacturing of the display panel 100 is completed through the above-described procedures.

Method of Applying Inks to Inside of Spaces 20 using Inkjet Method

The following describes the details of the method of applying the inks for forming the organic light-emitting layers 15 to the inside of the spaces 20 using the inkjet method.

In application of the inks for forming the organic light-emitting layers 15, a solution for forming the organic light-emitting layers 15 is applied by using an ink discharge device. An ink application process is repeated for each of three-color inks. Specifically, one of respective three-color inks for forming red, green, and blue light-emitting layers is applied to the substrate. Next, another one of the three-color inks is applied to the substrate. Lastly, the last one of the three-color inks is applied to the substrate. In this way, the three-color inks are applied in order. As a result, the red, green, and blue light emitting-layers alternate over the substrate.

Figure 6:
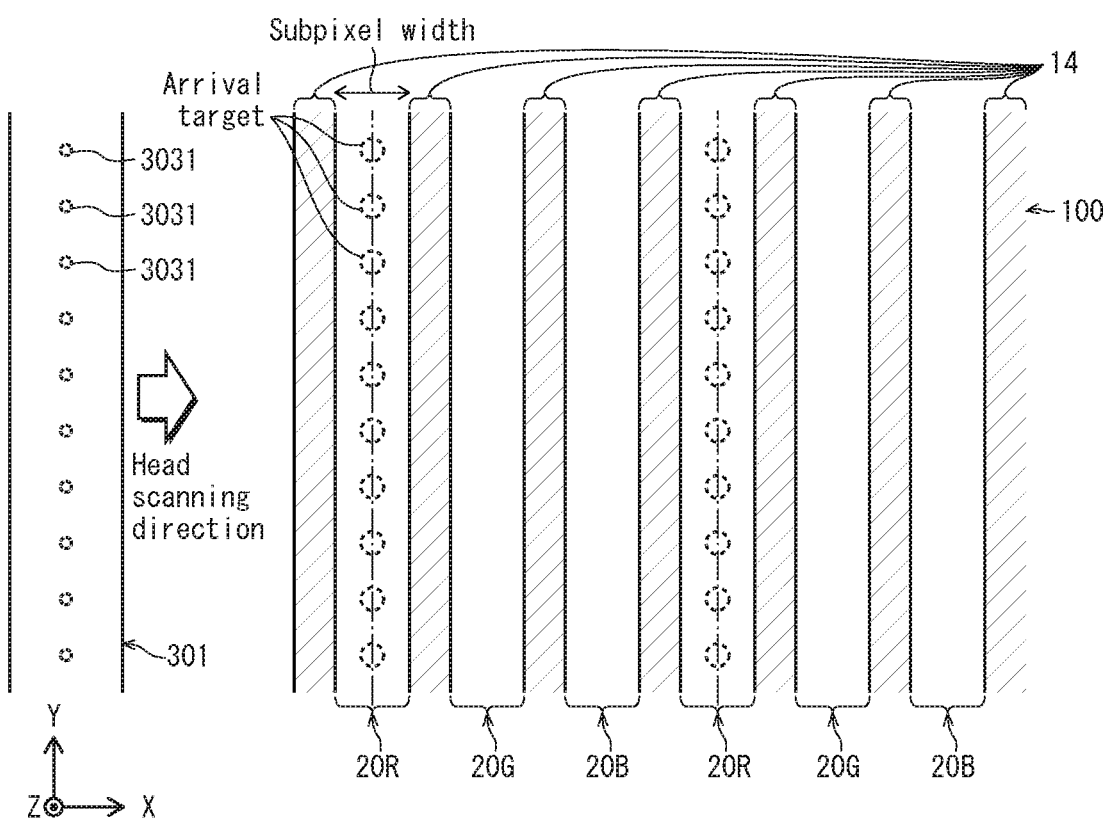
FIG. 6 is a schematic diagram illustrating a method of applying inks to spaces by using an inkjet method pertaining to at least one embodiment.

FIG. 6 is a schematic diagram illustrating a process of applying inks for forming light-emitting layers to the substrate pertaining to at least one embodiment, with respect to a case where the inks are uniformly applied to spaces 20 between first banks 14.

In formation of the light-emitting layers 15, red light-emitting layers 15R, green light-emitting layers 15G, and blue light-emitting layers 15B are respectively formed in spaces 20R for red subpixels, spaces 20G for green subpixels, and spaces 20B for blue subpixels in the regions defined by the banks having the line bank structure, with use of the ink layers 15a, which are solutions for forming the light-emitting layers 15. Note that the light-emitting layers 15R may differ in thickness from the light-emitting layers 15G and/or 15B. The light-emitting layers 15R can be formed so as to have a greater thickness than the light-emitting layers 15G and 15B by using, for example, an ink with a larger application amount for the spaces 20R than ones for the spaces 20B and/or 20G.

For the purpose of simplifying the description, ink application is sequentially performed with respect to all the spaces corresponding to first, second, and third colors in the following manner. Specifically, under a first condition for ink discharge amount from the nozzles, ink application is performed with respect to spaces 20 corresponding to the first color above the substrate. Then, under a second condition for ink discharge amount from the nozzles, ink application is performed with respect to spaces 20 corresponding to the second color above the substrate. Lastly, under a third condition of ink discharge amount from the nozzles, ink application is performed with respect to spaces 20 corresponding to the third color above the substrate. Note that different nozzles for ink discharge may be used for each of the first, second, and third ink colors.

(Method of Uniformly Applying Inks to Spaces 20 between First Banks 14)

The following describes a method of applying each of the three-color inks to spaces corresponding to the ink color (for example, the red ink for spaces corresponding to the red color).

The light-emitting layers 15 extend continuously not only over luminous regions (regions surrounded by the first banks 14 and the second banks 24 in FIG. 2) but also over non-luminous regions (regions above the second banks 24 in FIG. 2) which are disposed between the luminous regions. With this configuration, when forming the light-emitting layers 15, ink applied to the luminous regions can flow in the column direction via ink applied to the non-luminous regions, and thus film thickness between pixels in the column direction can be uniformized. Accordingly, it is unlikely that a large degree of film thickness unevenness occurs in the column direction, and thus luminance evenness between pixels and service life are improved.

According to this application method, the substrate is placed on a work table of the ink discharge device such that the first banks 14 are arranged in the Y direction. Then, application is performed by, while scanning in the X direction with use of an ink jet head 301 having discharge ports 3031 arranged in line in the Y direction, discharging ink from the discharge ports 3031 toward arrival targets that are set in the spaces 20 between the first banks 14.

Note that the ink for forming the light-emitting layers 15 with an equal application amount is applied to every three regions that are adjacent to each other in the X direction.

Here, the method of forming the light-emitting layers 15 is not limited to this method. Other commonly-known methods besides the inkjet method and a gravure printing method may be used for ink discharge and application. Such commonly-known methods include a dispenser method, a nozzle coating method, a spin coating method, an intaglio printing method, and a relief printing method.

[Method of Detecting and Repairing Defect Portion]

As described above in connection with the manufacturing method, but in more precise terms, the first banks 14 and the dam elements 52 are respectively formed by thermal firing and curing of the unfired first banks 14a and the unfired dam elements 52a having been formed. However, the unfired first banks 14a and the unfired dam elements 52a are somewhat solidified and already have stable shapes. As such, in the present disclosure, description is provided while simply referring to the unfired first banks 14a and the unfired dam elements 52a by using the terms first banks 14a and dam elements 52a, respectively.

[Defect Portion 3]

First, a defect portion 3 of a first bank 14a is described.

A defect portion 3 of a first bank 14a may be a foreign particle present at the first bank 14a, or may be a missing portion of the first bank 14a.

The foreign particle may be, for example, a piece of metal originating in manufacturing equipment, or dust or dirt originating in the atmosphere. The dust or dirt tends to be a piece of fabric.

FIG. 7A is a schematic perspective view illustrating an example in which a foreign particle has adhered onto one first bank 14a and has become a defect portion 3 pertaining to at least one embodiment. FIG. 7B is a schematic perspective view illustrating a state where a dam structure 50, which is composed of a pair of dam elements 52 disposed with the defect portion 3 therebetween in the Y direction, has been formed pertaining to at least one embodiment. As such, according to at least one embodiment, a dam structure 50 is composed of a pair of dam elements 52 disposed with the defect portion 3 therebetween in the Y direction. Further, one pair of dam elements 52 is disposed in one of two adjacent spaces 20 that are each located between the first bank 14a having the defect portion 3 and an adjacent first bank 14a, and the dam elements 52 composing the pair extend in the X direction from two points on the first bank 14a having the defect portion 3 to an adjacent first bank 14a.

Further, the plan-view width of the dam elements 52 is for example between 5 μm and 50 μm.

When dome-shaped ink layers 15a are formed in FIG. 5D by applying ink to two adjacent spaces 20 that are each located between a first bank 14a on which a foreign particle is present and an adjacent first bank 14a, there is a risk of the ink layers 15a coming in contact with the foreign particle. Consequently, some of the ink applied to each of the spaces 20 may flow into the other adjacent space 20, which results in inks of different light-emission colors (e.g., red ink and green ink) mixing.

According to at least one embodiment, a dam structure 50 is formed in one of two adjacent spaces 20 that are each located between a first bank 14 having a foreign particle and an adjacent first bank 14. Thus, in the one adjacent space 20, the dam structure 50 stops a mixed ink from spreading any further, and thereby prevents a color mixture region from spreading any further. Furthermore, the dam structure 50 prevents an ink applied outside a region defined by the dam structure 50 from coming in contact with the foreign particle and thus flowing into the other adjacent space 20.

Note that the defect portion 3 need not be a foreign particle having adhered onto the first bank 14a such as above. For example, in FIG. 8A, the defect portion 3 may be a foreign particle that has entered the inside of the first bank 14a and penetrates through a wall surface of the first bank 14 from one space 20 to an adjacent space 20. For example, in FIG. 8B, the defect portion 3 may be a foreign particle that has slipped beneath the first bank 14a and penetrates the first bank 14a from one space 20 to an adjacent space 20. With a foreign particle inside or beneath a first bank 14a, a gap serving as an ink flow channel may be formed in the first bank 14a, given poor adhesion between the foreign particle and the bank material. Particularly, when the foreign particle is a piece of fabric, the foreign particle itself unfortunately serves as an ink flow channel by absorbing ink. As such, even when the defect portion 3 is a foreign particle inside or beneath a first bank 14a, the defect portion 3 may bring about color mixture between ink layers 15a formed in two adjacent spaces that are each located between the first bank 14a having the foreign particle and an adjacent first bank 14a.

Further, in FIG. 8C, a portion of one first bank 14a has collapsed and has become a defect portion 3. A portion of a first bank 14a may collapse in such a manner, for example, when a portion of a bank material layer not having undergone sufficient polymerization in the bank material layer light exposure process, due to not being exposed to enough light, is washed away during the subsequent developing process. Even when the defect portion 3 is a collapsed portion of the first bank 14a, the collapsed portion may mediate color mixture between ink layers 15a formed in two adjacent spaces that are each located between the first bank 14a having the collapsed portion and an adjacent first bank 14a.

As described above, mixture of inks of different light-emission colors occurs at a portion of a first bank 14a where a foreign particle is present and at a collapsed portion of a first bank 14a, and the mixture of such inks may lead to light-emission in an undesired color. As such, such portions of first banks 14a are referred to as defect portions 3 of the first banks 14a.

[Detection of Defect Portion 3 and Forming of Dam Structures 50]

The detection of a defect portion 3 of a first bank 14a is performed by, for example, capturing an image of the surfaces of the first banks 14a formed above the ground substrate 11, and performing a pattern search on the image.

Figure 9:
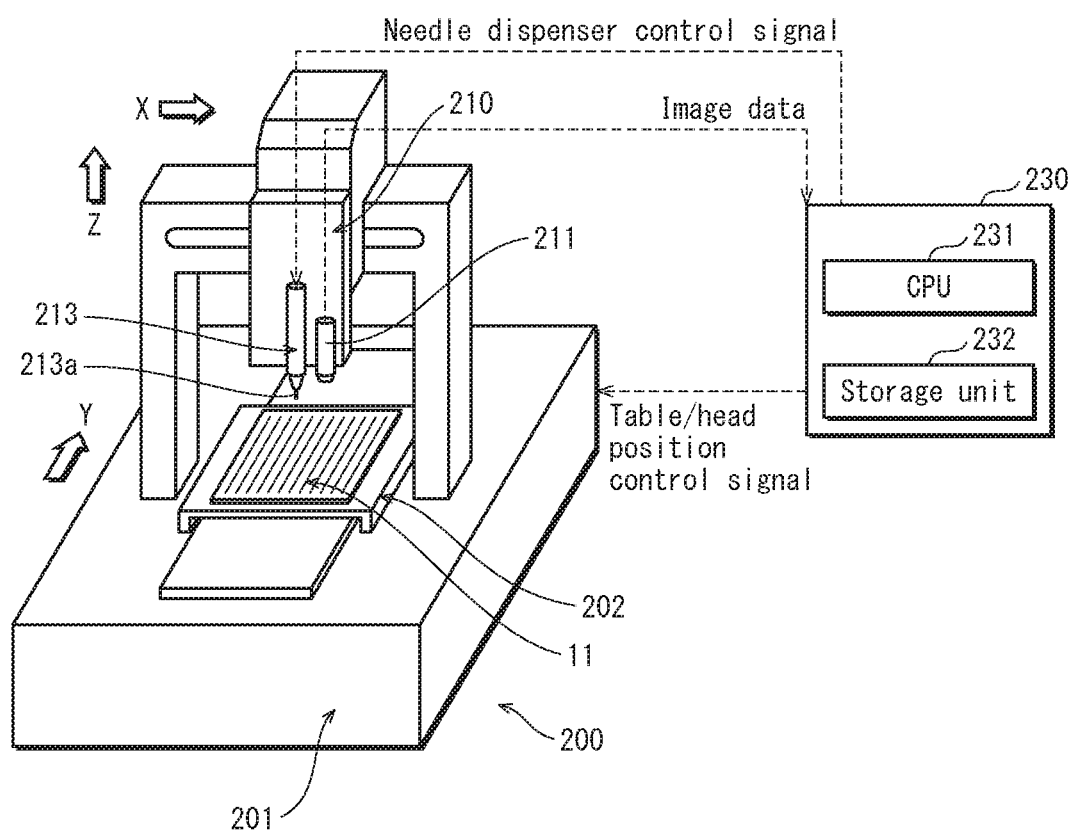
FIG. 9 is a schematic view illustrating the overall structure of one example of a repair device used for bank defect portion detection and bank repair pertaining to at least one embodiment.

FIG. 9 is a schematic view illustrating the overall structure of one example of a repair device used for detecting and repairing bank defect portions pertaining to at least one embodiment.

The repair device illustrated in FIG. 9 (repair device 200) includes a base 201, and a table 202 and a head portion 210 above the base 201. The table 202 is a table on which the ground substrate 11 is placed. The head portion 210 has attached thereto an image capture element 211 and a needle dispenser 213. The table 202 is moveable along the Y direction in accordance with an instruction from a CPU 231 of a controller 230. The head portion 210 is likewise moveable along the X direction and the Z direction in accordance with an instruction from the CPU 231.

Accordingly, in accordance with an instruction from the CPU 231, the needle dispenser 213, which is attached to the head portion 210, is capable of moving above the ground substrate 11 and in the X direction, the Y direction, and the Z direction relative to the ground substrate 11, which is placed on the table 202.

Here, the ground substrate 11 is in a state where the pixel electrodes 12, the hole injection layer 13, the first banks 14a, and the second banks 24a have already been formed above the ground substrate 11.

Figure 10A:
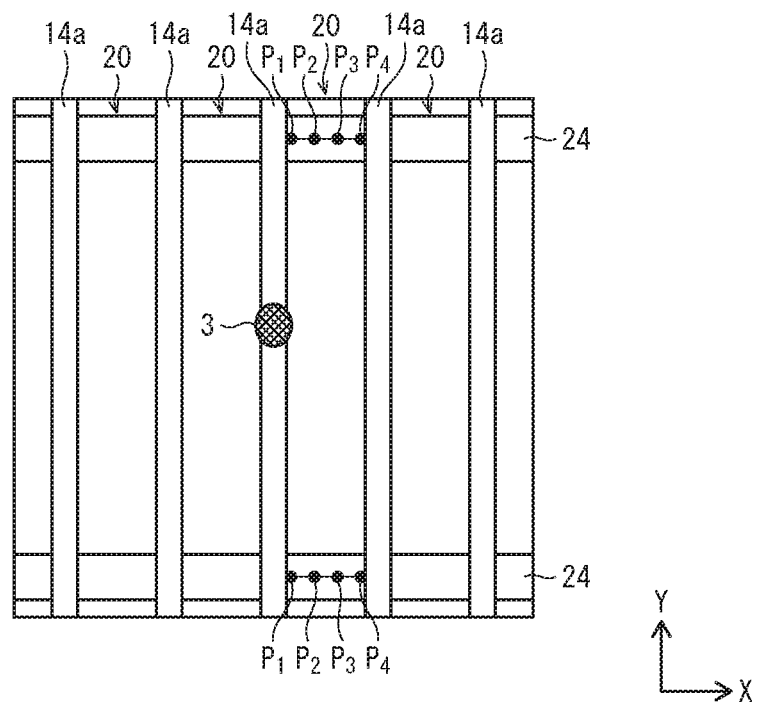
FIG. 10A is a schematic plan view illustrating positions to which repair material is to be applied by using a needle dispenser, set in a bank defect portion, pertaining to at least one embodiment.
Figure 10B:
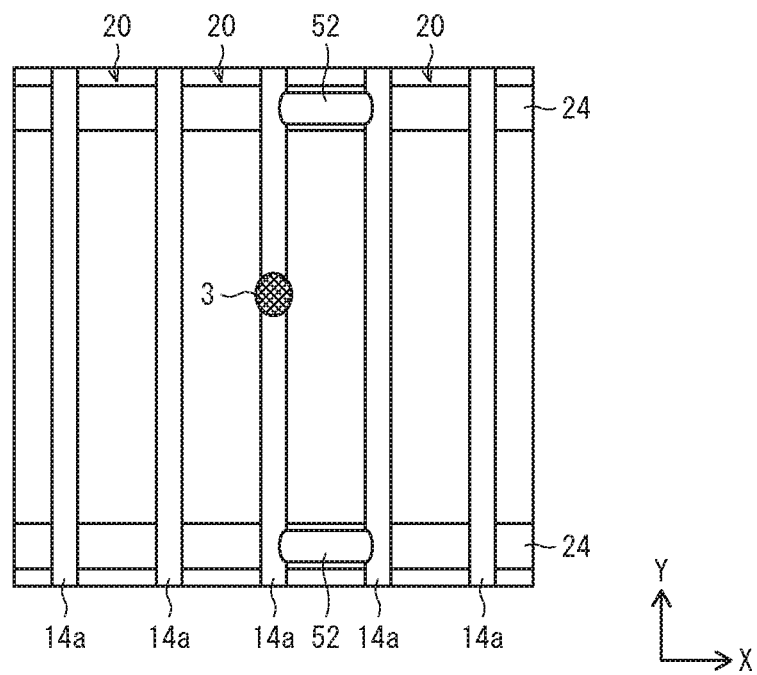
FIG. 10B is a schematic plan view illustrating a state where a dam structure has been formed pertaining to at least one embodiment.

FIG. 10A is a schematic plan view illustrating forming position of a dam structure 50 pertaining to at least one embodiment. FIG. 10B is a schematic plan view illustrating a state where dam elements 52 have been formed pertaining to at least one embodiment.

As such, each of dam elements 52 in any space 20 is formed by using the needle dispenser 213 and applying the repair material to a plurality of predetermined positions set along a line (dam forming line) on which the dam element 52 is to be formed.

In FIG. 10A, when a defect portion 3 is detected on a first bank 14a, coordinates positions indicating end portions of the defect portion 3 (a foreign particle in this example) in the Y direction are acquired. A dam forming line is set on each of two adjacent second banks 24 that are the closest to the acquired coordinate positions and sandwich the defect portion 3 therebetween in the Y direction. Points $P_1$, $P_2$, $P_3$, and $P_4$ illustrated in FIG. 10A indicate application positions by the needle dispenser that are set along the dam forming lines.

FIG. 11A through FIG. 11G are diagrams illustrating how a dam element 52 is formed by applying the repair material to the application points $P_1$, $P_2$, $P_3$, and $P_4$, one after another pertaining to at least one embodiment.

The repair device 200 forms a dam element 52 by applying the repair material to the application points $P_1$, $P_2$, $P_3$, and $P_4$, which have been set as described above, one after another by using a needle 213a. The needle dispenser 213 has a tank 213b attached at a tip portion thereof. The tank 213b stores the repair material. The needle dispenser 213 is capable of applying the repair material in microliter units by moving the needle 213a up and down through the tank 213b to cause the repair material to adhere to the needle 213a.

Figure 11A:
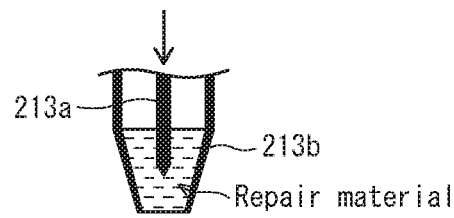
FIG. 11A through FIG. 11G are schematic cross-sectional views illustrating how a dam structure is formed through application of repair material with the needle dispenser pertaining to at least one embodiment, with FIG. 11A illustrating a state of a tank and a needle before the application of the repair material, FIG. 11B illustrating a state where the repair material has been applied to application point Pi by using the needle dispenser, FIG. 11C illustrating a state where the needle is being moved upward, FIG. 11D illustrating a state where the needle has been moved upward, FIG. 11E illustrating a state where the repair material has been applied to application point $P_2$ after moving the needle and the tank, FIG. 11F illustrating a state where the repair material having been applied to application point $P_1$ and the repair material having been applied to application point $P_2$ have connected, and FIG. 11G illustrating a state where the needle has been moved upward.
Figure 11B:
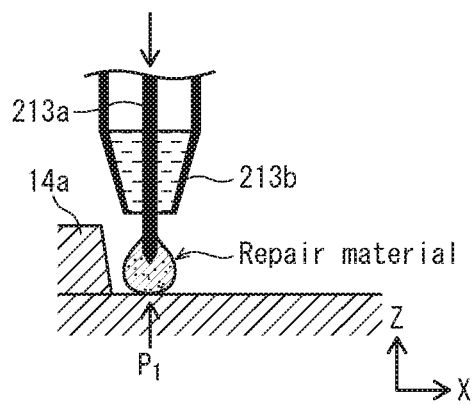
Figure 11E:
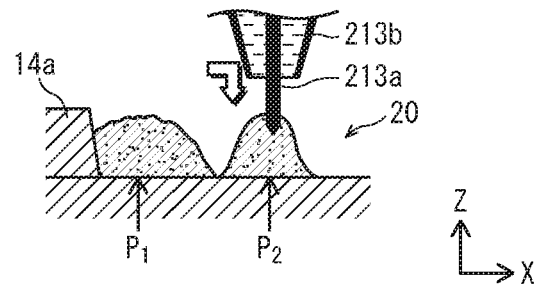
Figure 11C:
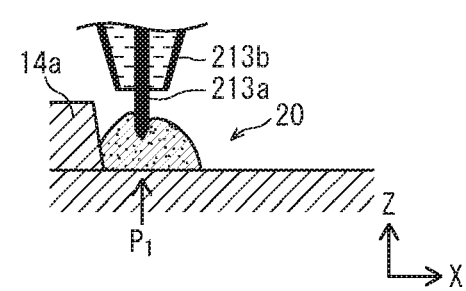

First, in FIG. 11A and FIG. 11B, with the needle 213a and the tank 213b positioned above application point $P_1$, the needle 213a is moved downward so that the repair material adheres to the needle 213a. Then, the needle 213a is moved toward application point $P_1$ to apply the repair material to application point $P_1$.

The repair material has fluidity until application. However, after application, the repair material maintains a mound shape. Thus, in FIG. 11C, a mound of the repair material is formed at application point $P_1$.

Subsequently, in FIG. 11D, the needle 213a is withdrawn upwards into the tank 213b, and the needle 213a and the tank 213b are moved to application point $P_2$. Subsequently, in FIG. 11E, the needle 213a is moved downward so that the repair material adheres to the needle 213a, and then the needle 213a is moved toward application point $P_2$ to apply the repair material to application point $P_2$.

Figure 11F:
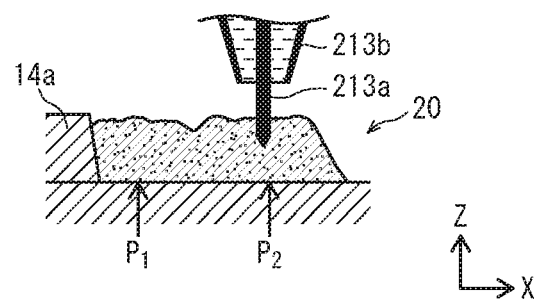
Figure 11D:
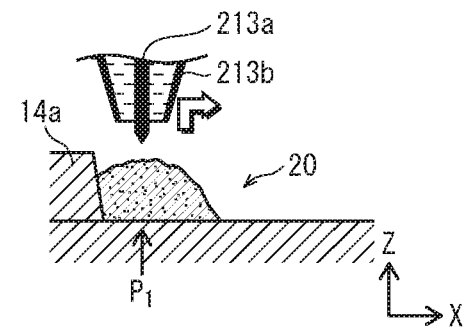

Then, the mound of the repair material that is formed at application point $P_2$ connects to the mound of the repair material having been formed at application point $P_1$ in FIG. 11F.

Figure 11G:
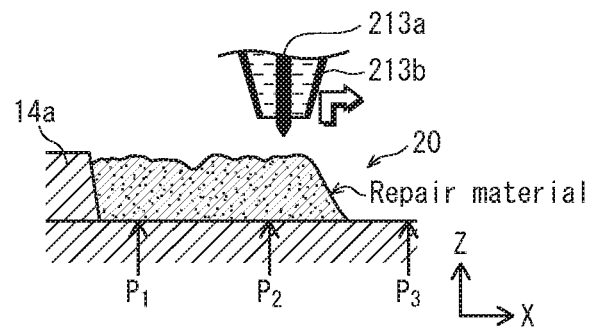

Then, in FIG. 11G, the needle 213a is withdrawn upwards and moved to application point $P_3$.

Then, in a similar manner as described above, a mound of the repair material is formed at application point $P_3$, which connects to the mound of the repair material having been formed at application point $P_2$. Further, a mound of the repair material is formed at application point $P_4$, which connects to the mound of the repair material having been formed at application point $P_3$.

As such, mounds of the repair material are formed continuously on a line extending from a point on the first bank 14a having the defect portion 3 to an adjacent first bank 14a. Then, the mounds of the repair material so applied are dried and exposed to light as needed, thereby forming a dam element 52.

Note that the subsequent simultaneous firing process causes the repair material so applied to harden. Thus, the dam element 52 is provided with even higher physical stability.

By executing the process described above for two dam elements 52, a dam structure 50 is formed.

Through the above-described dam structure forming process, a pair of dam elements 52 is formed in one of two adjacent spaces 20 that are each located between a first bank 14 having a defect portion 3 and an adjacent first bank 14 in FIG. 7B. The dam elements 52 partition the space 20 into a first space SA in the vicinity of the defect portion 3 and two second spaces SB outside the vicinity of the defect portion 3.

When the subsequent light-emitting layer forming process of Step S9 (refer to FIG. 4) is performed after repairing any defect portion 3 of the first banks 14 in such a manner, ink is applied to the first space SA and the second spaces SB while ink mixture is confined within a specific region as described in detail later, thus forming organic light-emitting layers 15.

Note that the repair material may be any resin composition that hardens when exposed to light, heat, or the like.

The resin may be, for example, a curable resin containing an ethylene double bond, such as a (meth) acryloyl group, an aryl group, a vinyl group, or a vinyloxy group.

Also, a cross-linking agent, such as an epoxy compound or a polyisocyanate compound, that forms a cross-link with the resin may also be contained in the repair material as an additive.

The resin in the repair material may be a fluoride polymer, in which fluoride atoms are included in the resin structure. Using resin including fluoride atoms as the repair material provides liquid repellency to dam structures 50 formed by using the repair material. Alternatively, various liquid repellent agents may be added to the resin. In any case, the content of the liquid repelling agent should be between 0.01 wt % and 10 wt %. Adding a liquid repelling agent by an amount within this range ensures that the resin compound is stable during storage, and also provides dam structures 50 formed by using the repair material with high liquid repellency.

Also, the same material as the bank material used for forming the first banks 14a may be used as the repair material.

Further, the resin composition in the repair material may contain a solvent and a photopolymerization initiator as additives, when necessary.

The solvent may be one or more types of solvents that have solubility in resins and have a boiling point approximately within the range between 150° C. and 250° C.

The photopolymerzation initiator may be any type of photopolymerization initiator available on the market.

Further, upon the application of the repair material, the repair material is adjusted so that the content of solid components in the repair material is between, for example, 20 wt % and 90 wt %, and the repair material has a viscosity between, for example, 10 cP and 50 cP (where cP is the unit centipoise).

Further, the amount of the photopolymerization initiator added is adjusted in accordance with the amount of light exposure in the light exposure process performed before the firing process. For example, the amount of the photopolymerzation initiator added is to be adjusted such that the content of the photopolymerzation initiator with respect to the total solid component of the repair material is between 0.1 wt % and 50 wt % in at least one embodiment, and is between 5 wt % and 30 wt % in at least one embodiment.

[Effect of Forming Dam Structures 50]

The following describes the spread of a color mixture region with reference to comparison between a case where a dam structure 50 is formed and a case where no dam structure 50 is formed.

FIG. 12A is a plan view illustrating a state where, in a display panel pertaining to at least one embodiment, a pair of dam elements 52 has been formed around a first bank 14 having a defect portion 3, and an ink layer 15a (R) has been formed in one of two adjacent spaces 20 that are each located between the first bank 14 having the defect portion 3 and an adjacent first bank 14, through the application of red ink and an ink layer 15a (G) has been formed in the other one of the two adjacent spaces 20 through the application of green ink. Meanwhile, FIG. 12B is a plan view illustrating a state where, in a comparative example pertaining to at least one embodiment in which dam structures 50 are not formed, an ink layer 15a (R) and an ink layer 15a (G) have been formed in two adjacent spaces 20 that are each located a first bank 14 having a defect portion 3 and an adjacent first bank 14.

In FIG. 12B, without the dam structures 50 formed around the defect portion 3, the red ink and the green ink mix via the defect portion 3 and produce, in each of the two ink layers 15a, a color mixture region that extends in the Y direction. This color mixture region extends far in the Y direction, and the length thereof may extend to around several centimeters.

Once the manufacturing of the display panel 100 is completed, these color mixture regions emit light having a color different from the originally specified color.

Note that in the case where a color filter is provided, an unnecessary color of the light is cut, allowing observation of the originally specified color. However, the luminance of the light through the color filter might decrease. Furthermore, once the manufacturing of the display panel 100 is completed, the light-emitting layers in the color mixture regions tend to have an undesired film thickness, and accordingly exhibit undesired luminous efficiency, voltage, and so on.

In FIG. 12A compared with this, a dam structure 50, which is composed of a pair of dam elements 52, has been formed in a space 20G to which a green ink is applied among two adjacent spaces 20 that are each located between a first bank 14 having a defect portion 3 and an adjacent first bank 14. In FIG. 12A, even if a color mixture region is produced in a region defined by the dam structure 50, the color mixture region cannot spread beyond the dam elements 52. Also, an amount of the green ink, which is applied to the space 20G in which the dam structure 50 has been formed, flowing via the defect portion 3 into the adjacent space 20R to which a red ink is applied, is confined to at most an amount applied inside the region defined by the dam structure 50. In other words, even if the green ink, which is applied inside the region defined by the dam structure 50, flows into the adjacent space 20R via the defect portion 3, the green ink applied outside the range cannot flow into the adjacent space 20R via the defect portion 3.

In FIG. 12A, the color mixture region extends far in the Y direction in the space 20 to which the red ink is applied among the two adjacent spaces, which are each located between the first bank 14 having the defect portion 3 and the adjacent first bank 14. This is similar to the comparative example where no dam structure 50 has been formed around the defect portion 3. However, owing to the small green-ink amount flowing via the defect portion 3, change in light-emission color in the color mixture region in the space 20R from the originally specified color is confined to a negligible degree, as described above.

Thus, by forming a dam structure 50 in only one of two adjacent spaces 20 that are each located between a first bank 14 having a defect portion 3 and an adjacent first bank 14, a display element failure caused by the defect portion 3 occurs only in a region defined by the dam structure 50 in the space 20. According to at least one embodiment, a dam structure 50 (a pair of dam elements 52) is formed on two second banks 24, and accordingly a color mixture region produced in a region defined by the dam structure 50 coincides with a single subpixel region. In other words, occurrence of the display element failure caused by the defect portion 3 can be confined within a single subpixel in a space 20 in which the dam structure 50 is formed.

[Determination of Repair Target Spaces]

The following describes a method of determining a space 20 in which a dam structure 50 is to be formed (hereinafter, repair target space) among two adjacent spaces 20 that are each located between a first bank 14 having a defect portion 3 and an adjacent first bank 14.

In the case where a dam structure 50 is formed in only one of two adjacent spaces 20 that are each located between a first bank 14 having a defect portion 3 and an adjacent first bank 14, color mixture regions are formed in FIG. 12A. Specifically, in the space 20 in which no dam structure 50 is formed, the color mixture region spreads far along the first banks 14 in the Y direction. Meanwhile, in the space 20 in which the dam structure 50 is formed, the color mixture region spreads only within a region defined by the dam structure 50. Thus, according to at least one embodiment, in consideration of change in light-emission color from the originally specified one with respect to one space 20 in which no dam structure 50 has been formed and an adjacent space 20 in which a dam structure 50 has been formed, a repair target space is determined, such that the one space 20 in which a color mixture region having a larger surface area is produced than in the adjacent space 20, that is, the one space 20 in which no dam structure 50 has been formed, is smaller in terms of change in light-emission color from the originally specified color than the adjacent space 20 in which the dam structure 50 has been formed, compared with the case where the adjacent space 20 has no dam structure 50.

When the display panel 100 is manufactured using a panel whose light-emitting layer has a color mixture region, the color mixture region emits light of a color differing from the originally specified color. Typically, when light-emitting materials of different light-emission colors are mixed, the light-emission color having longer wavelength becomes dominant. This is because it is regarded that a light-emitting material with a light-emission color having a longer wavelength has a smaller energy level (energy gap) relevant to light emission, and thus tends to emit light more easily.

In view of this, according to at least one embodiment, in the case where a dam structure 50 is formed in only one of two adjacent spaces 20 that are each located between a first bank 14 having a defect portion 3 and an adjacent first bank 14, the one space 20 to which an ink of a light-emission color having a shorter wavelength is to be applied than the other space 20 is determined as a repair target space.

Figure 13:
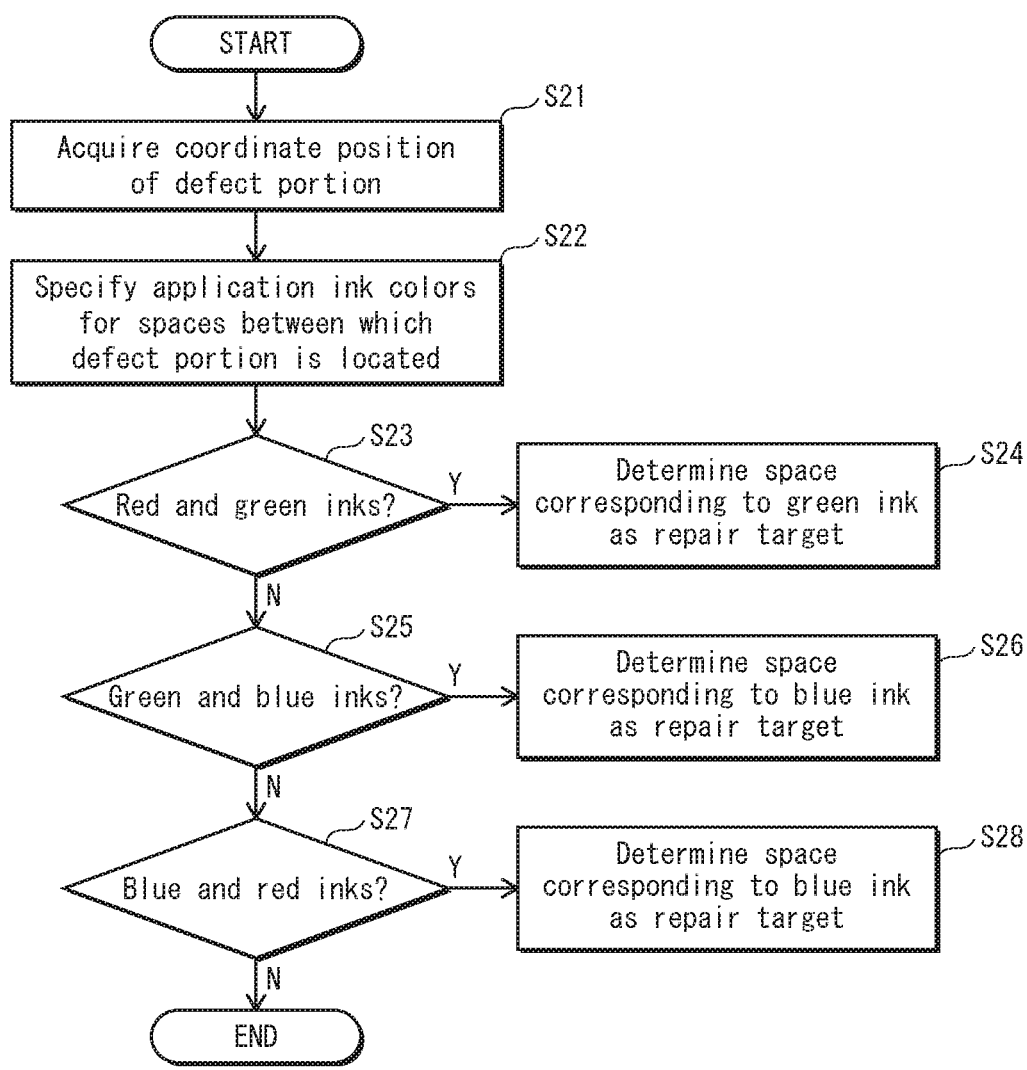
FIG. 13 is a flow chart illustrating one example of processing of determining a repair target space pertaining to at least one embodiment.

FIG. 13 is a flow chart illustrating processing of determining a repair target space performed by the repair device 200 pertaining to at least one embodiment. Note that a storage unit 232 of the repair device 200 has stored beforehand therein coordinate positions in the X direction of first banks 14 and information indicating ink colors to be applied to spaces 20.

When the processing starts, a coordinate position of a defect portion 3 in the X direction is firstly acquired (Step S21).

Next, with reference to the coordinate positions in the X direction of the first banks 14 and the information indicating the ink colors to be applied to the spaces 20, which are stored in the storage unit 232 of the repair device 200, two adjacent spaces 20 that are each located between a first bank 14 having the defect portion 3 and an adjacent first bank 14 are specified, and respective ink colors to be applied to the specified spaces 20 are further specified (Step S22).

In the case where the respective ink colors to be applied to the two adjacent spaces 20, between which the first bank 14 having the defect portion is located, are red and green colors (Step S23: Yes), one of the spaces 20 to which the green ink, which has a shorter wavelength than the red ink, is to be applied is determined as a repair target space (Step S24).

In the case where the respective ink colors to be applied to the two adjacent spaces 20, between which the first bank 14 having the defect portion is located, are green and blue colors (Step S25: Yes), one of the spaces 20 to which the blue ink, which has a shorter wavelength than the green ink, is to be applied is determined as the repair target space (Step S26).

In the case where the respective ink colors to be applied to the spaces 20, between which the first bank 14 having the defect portion is located, are blue and red colors (Step S27: Yes), one of the spaces 20 to which the blue ink, which has a shorter wavelength than the red ink, is to be applied is determined as the repair target space (Step S28).

According to at least one embodiment, the repair target space is determined in this way.

[Modifications]

The display panel 100 pertaining to at least one embodiment is described as above. However, the present disclosure is not limited to at least one embodiment above except the essential characteristic compositional elements thereof. For example, the present disclosure also includes an embodiment obtained through various types of modifications which could be conceived of by one skilled in the art to at least one embodiment above, an embodiment obtained through any combination of the compositional elements and the functions in at least one embodiment above without departing from the spirit of the present disclosure. The following describes modifications of the display panel 100 as examples of such embodiments.

<First Modification>

According to at least one embodiment above, the dam elements 52 are formed on the second banks 24. However, the forming position of the dam elements 52 is not limited to this.

Figure 14A:
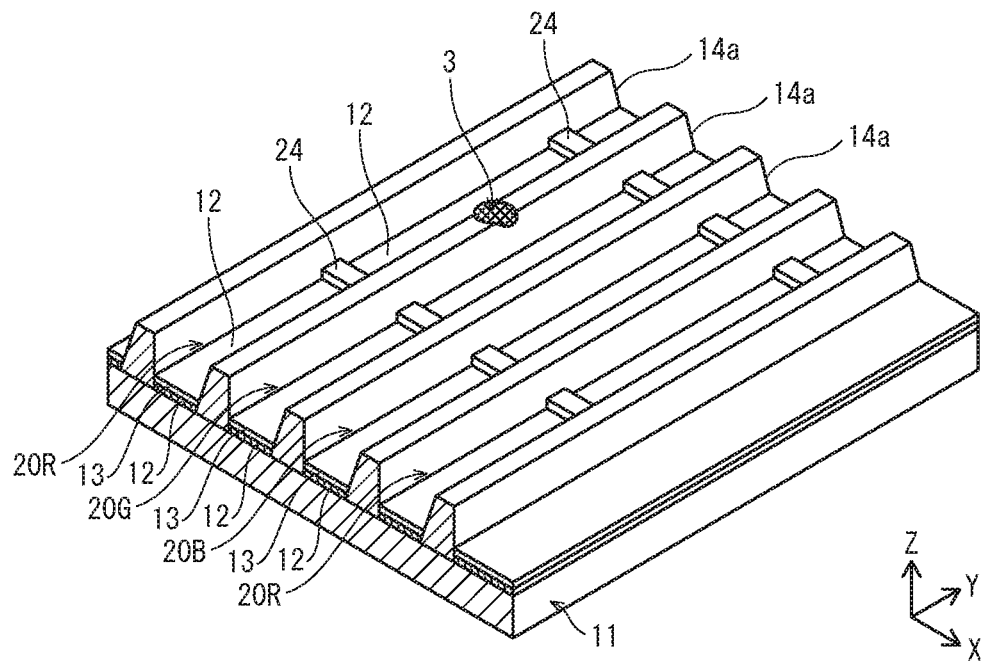
FIG. 14A is a schematic perspective view illustrating one example of a bank defect portion pertaining to at least one embodiment.
Figure 14B:
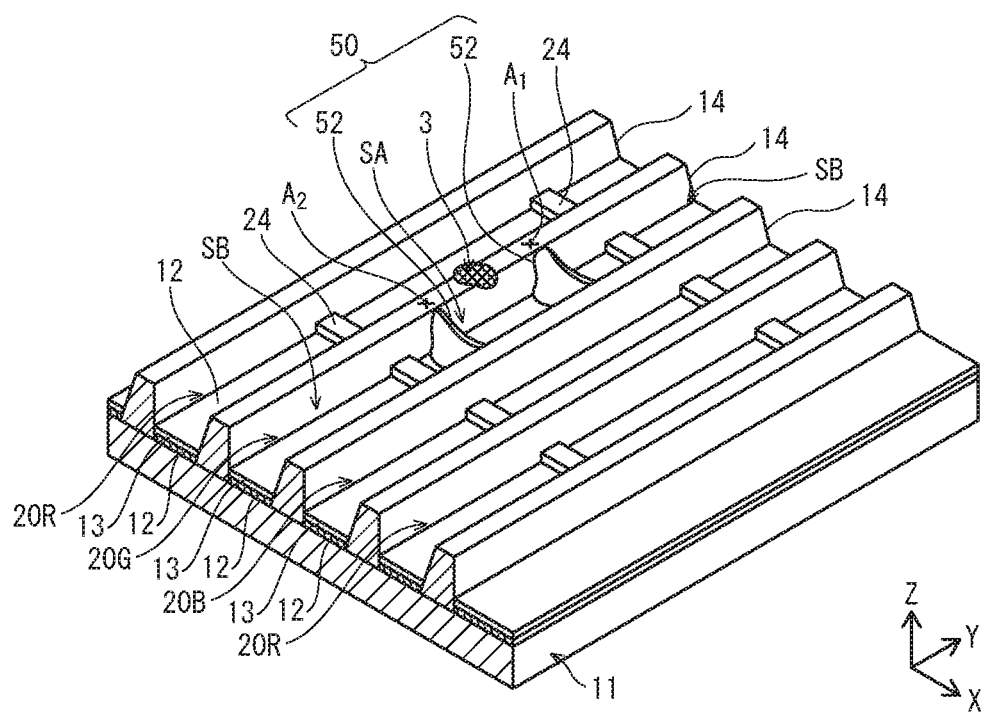
FIG. 14B is a schematic perspective view illustrating a state where a dam structure has been formed around the bank defect portion pertaining to at least one embodiment.

FIG. 14A and FIG. 14B are schematic perspective views illustrating forming position of dam elements 52 pertaining to the first modification.

FIG. 14A illustrates a state where a foreign particle has adhered onto one first bank 14a and has become a defect portion 3. FIG. 14B illustrates a state where a dam structure 50, which is composed of a pair of dam elements 52 disposed with the defect portion 3 therebetween in the Y direction, has been formed.

Figure 15A:
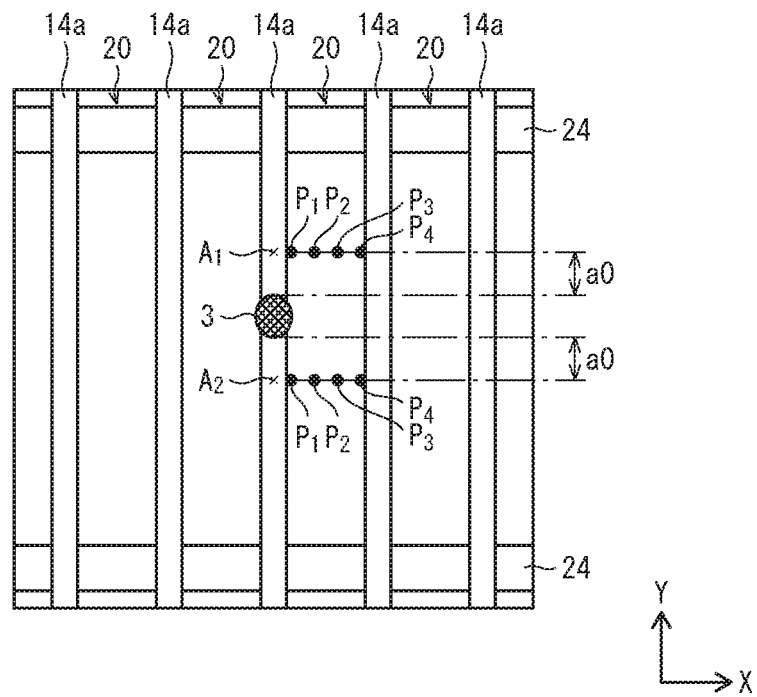
FIG. 15A is a schematic plan view illustrating positions to which a repair material is to be applied by using the needle dispenser, set in a bank defect portion, pertaining to at least one embodiment.
Figure 15B:
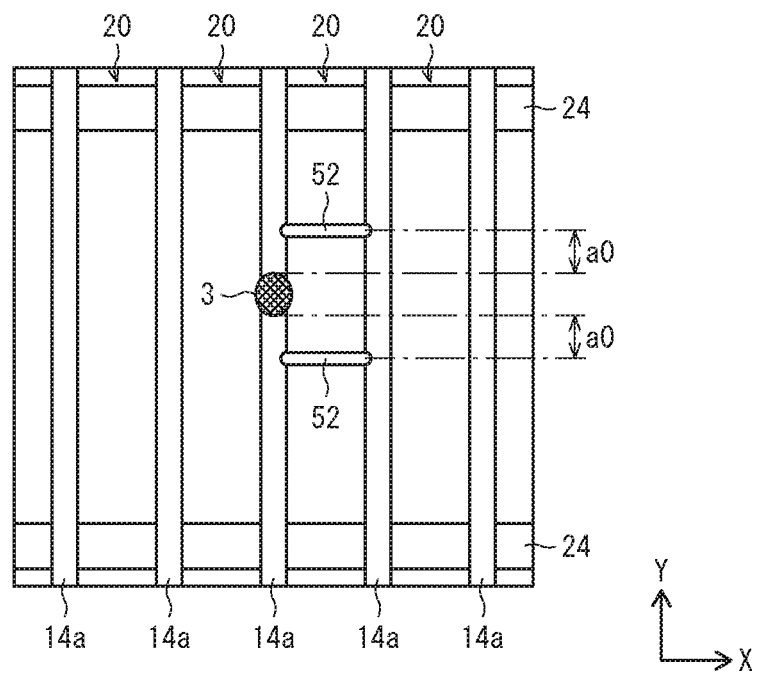
FIG. 15B is a schematic plan view illustrating a state where a dam structure has been formed pertaining to at least one embodiment.

FIG. 15A is a schematic plan view illustrating forming position of a dam structure 50 pertaining to the first modification. FIG. 15B is a schematic plan view illustrating a state where the dam structure 50 has been formed pertaining to the first modification.

In FIG. 15A, when a defect portion 3 is detected on a first bank 14a, respective coordinates positions indicating two end portions of the defect portion 3 in the Y direction are acquired. Further, values $A_1$ and $A_2$ are calculated by adding a tolerance value a0 to the respective coordinate values. The values $A_1$ and $A_2$ so calculated are set as candidate forming positions for the dam structure 50. Then, in FIG. 15A, in one of two adjacent spaces 20 partitioned by the first bank 14a having the defect portion 3, application points $P_1$, $P_2$, $P_3$, and $P_4$ are set along each of (i) a dam forming line extending in the X direction through point $A_1$ and (ii) a dam forming line extending in the X direction through point $A_2$. Points $A_1$ and $A_2$ are points located at a distance corresponding to the tolerance value a0 in the Y direction from the respective end portions of the defect portion 3.

The dam structure 50 is formed in this way in a luminous region of a pixel partitioned by the second banks 24. Owing to this structure, normal light-emission is expected outside a region defined by the dam structure 50, thereby reducing a surface area where a display element failure occurs.

<Second Modification>

According to at least one embodiment above, the dam structure 50, which is composed of a pair of dam elements 52 disposed with a defect portion 3 therebetween in the Y direction, is formed in a repair target space at a predetermined distance or less from the defect portion 3. However, the shape of the dam structure 50 is not limited to this.

Figure 16A:
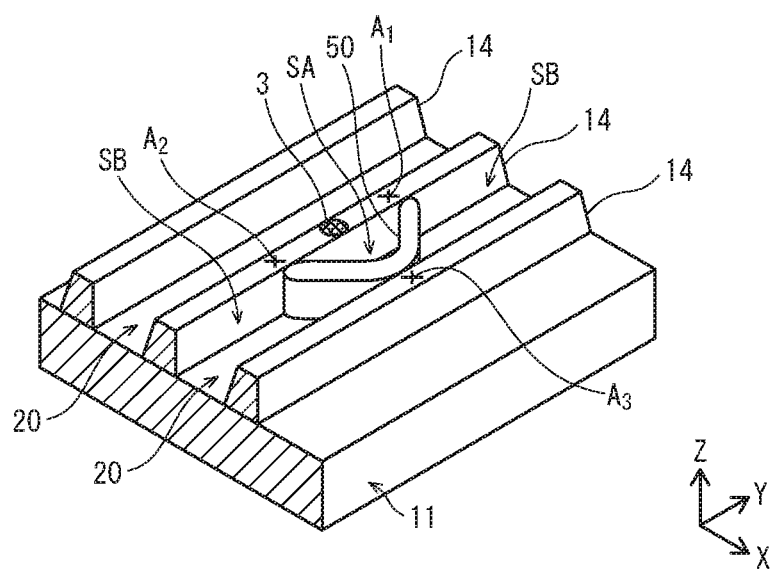
FIG. 16A is a schematic perspective view illustrating the shape of a dam structure pertaining to at least one embodiment.
Figure 16B:
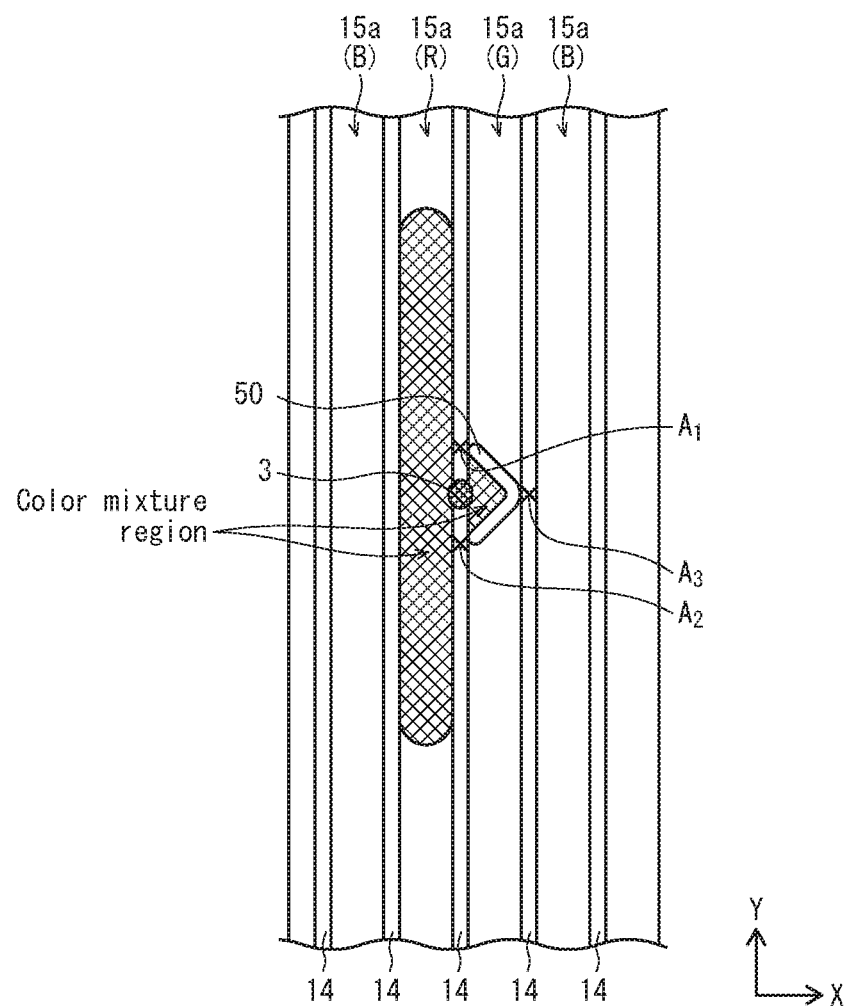
FIG. 16B is a schematic plan view illustrating a state where ink layers have been formed after the dam structure has been formed in a space pertaining to at least one embodiment.

FIG. 16A is a schematic perspective view illustrating the shape of a dam structure 50 pertaining to the second modification, and FIG. 16B is a schematic plan view illustrating a state where ink layers have been formed after the dam structure 50 has been formed in a space 20 pertaining to the second modification.

The dam structure 50 pertaining to the present modification has the shape illustrated in FIG. 16B. Specifically, in plan view of the X-Y plane, the dam structure 50 extends between two points (point $A_1$ and point $A_2$) between which a defect portion 3 is located in the Y direction, while detouring around the defect portion 3. Also, the dam structure 50 comes in contact with a first bank 14 adjacent to a first bank 14 having the defect portion 3 at point $A_3$ located at some point along the path between point $A_1$ and point $A_2$.

According to the second modification, the dam structure 50 can be formed by using a method similar to the method described in at least one embodiment above with reference to FIG. 11A through FIG. 11G. Specifically, in the second modification, the dam structure 50 can be formed by using a needle dispenser and applying the repair material to a plurality of application points set along a dam forming line that extends between point $A_1$ and point $A_2$ via point $A_3$, one after another.

<Third Modification>

According to at least one embodiment above, the dam structure 50, which is composed of a pair of dam elements 52 disposed with a defect portion 3 therebetween in the Y direction, is formed in a repair target space at a predetermined distance or less from the defect portion 3. However, the shape of the dam structure 50 is not limited to this.

Figure 17A:
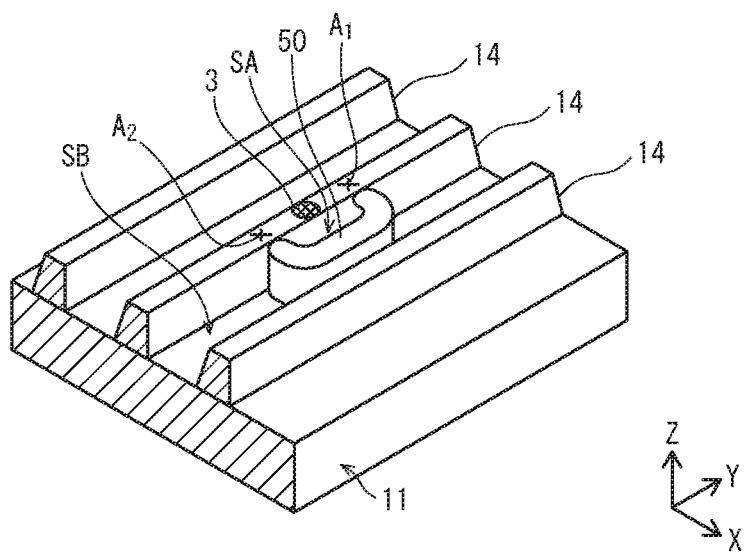
FIG. 17A is a schematic perspective view illustrating the shape of a dam structure pertaining to at least one embodiment.
Figure 17B:
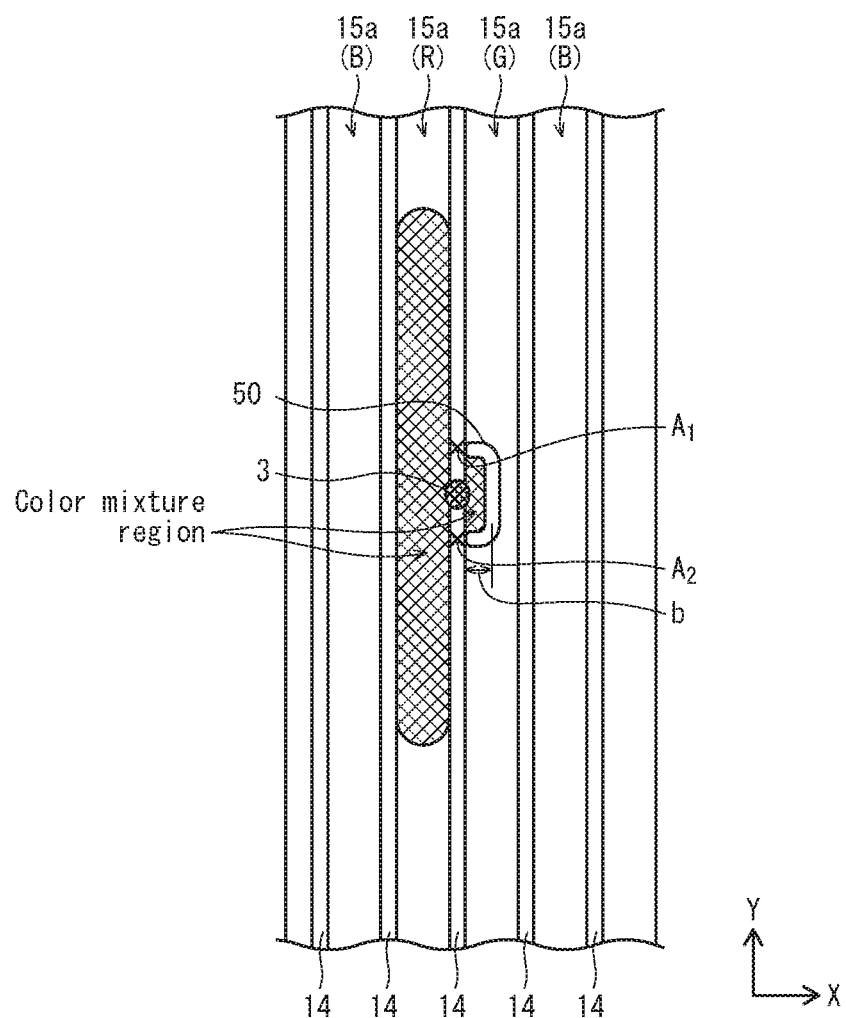
FIG. 17B is a schematic plan view illustrating a state where ink layers have been formed after the dam structure has been formed in a space pertaining to at least one embodiment.

FIG. 17A is a schematic perspective view illustrating the shape of a dam structure 50 pertaining to the fourth modification, and FIG. 17B is a schematic plan view illustrating a state where ink layers have been formed after the dam structure 50 has been formed in a space 20 pertaining to the fourth modification.

The dam structure 50 pertaining to the present modification has the shape illustrated in FIG. 17B. Thus, the dam structure 50 pertaining to the present modification is similar to the dam structure 50 pertaining to the second modification in that in plan view of the X-Y plane, the dam structure 50 extends between two points (point $A_1$ and point $A_2$) between which a defect portion 3 is located in the Y direction, while detouring around the defect portion 3. However, the dam structure 50 pertaining to the present modification differs from the dam structure 50 pertaining to the second modification in that the dam structure 50 does not come in contact with a first bank 14 adjacent to a first bank 14 having the defect portion 3. In other words, the dam structure 50 pertaining to the third modification is such that a maximum X-direction distance b between the dam structure 50 and the center of the defect portion 3 is set so as to be smaller than the width (X-direction width) of the space 20.

The dam structure 50 can also be formed by using a method similar to the method described in at least one embodiment above with reference to FIG. 11A through FIG. 11G. Specifically, the dam structure 50 can be formed by using a needle dispenser and applying the repair material to a plurality of application points set along a dam forming line that extends between point $A_1$ and point $A_2$, one after another.

<Fourth Modification>

At least one embodiment above describes bank repair methods and forms of banks while taking a top emission organic EL display panel as an example. However, the technology pertaining to the present disclosure is also applicable to a bottom emission organic EL display panel.

<Fifth Modification>

At least one embodiment above describes bank repair methods and forms of banks while taking an organic EL display panel as an example. However, display panels to which the technology pertaining to the present disclosure is applicable are not limited to organic EL display panels. The technology pertaining to the present disclosure is also applicable to display panels of any type including self-luminous layers that have been formed in banks having the line bank structure through the wet process. For example, the technology pertaining to the present disclosure is also applicable to display panels including self-luminous layers, which have been formed through the wet process in banks having the line bank structure by using a solvent in which electroluminescence quantum dots have been dispersed. Such display panels exhibit the similar effects.

[Supplementary Description]

The following further describes the structure of the present disclosure.

(1) A method pertaining to at least one aspect of the present disclosure is a method of manufacturing a self-luminous display panel. The method includes: preparing a substrate; forming banks above the substrate; detecting a bank having a defect portion among the banks; determining, with respect to the detected bank having the defect portion, only one of two adjacent spaces as a repair target space; forming a dam structure in the repair target space; and forming light-emitting layers. The banks are each elongated and each extend in a column direction, and are arranged in a row direction with spaces therebetween. The two adjacent spaces are each located between the detected bank and a bank adjacent to the detected bank in the row direction. The dam structure is located within a predetermined distance from the defect portion. The dam structure at least partially surrounds the defect portion, or is composed of a pair of dam elements disposed with the defect portion therebetween in the column direction. The light-emitting layers are formed by applying inks to the spaces between the banks. The inks contain self-luminous materials.

(2) According to at least one embodiment, the determining determines, as the repair target space, the one space in which a light-emitting layer emitting light at a shorter wavelength is to be formed than in the other space.

(3) According to at least one embodiment, in the forming of the light-emitting layers, an ink that is applied to a region defined by the dam structure in the repair target space flows into the other space via the defect portion.

(4) According to at least one embodiment, in the forming of the light-emitting layers, an ink that is applied to the other space flows into a region defined by the dam structure in the repair target space via the defect portion.

(5) A self-luminous display panel pertaining to at least one aspect of the present disclosure is a self-luminous display panel including: a substrate; banks disposed above the substrate; and light-emitting layers. The banks are each elongated and extend in a column direction, and are arranged in a row direction with spaces therebetween. The light-emitting layers contain self-luminous materials, and are formed by applying inks to the spaces between the banks. At least one of the banks has a defect portion. With respect to the bank having the defect portion, a dam structure is provided in only one of two adjacent spaces that are each located between the bank and a bank adjacent to the bank in the row direction. The dam structure is located within a predetermined distance from the defect portion. The dam structure at least partially surrounds the defect portion, or is composed of a pair of dam elements disposed with the defect portion therebetween in the column direction.

(6) According to at least one embodiment, the dam structure is provided in the one space in which a light-emitting layer emitting light at a shorter wavelength is formed than in the other space.

(7) According to at least one embodiment, the other space includes a self-luminous material that is contained in an ink applied to the one space.

(8) According to at least one embodiment, the one space includes a self-luminous material that is contained in an ink applied to the other space.

According to the method of manufacturing the self-luminous display panel pertaining to at least one embodiment, as described above, a dam structure is provided in one of two adjacent spaces that are each located between a bank having a defect portion and an adjacent bank. Owing to this structure, in formation of organic functional layers by applying inks of different light-emission colors to spaces between banks, a color mixture region, where inks of different light-emission colors mix with one another, does not spread beyond the dam structure in the one space in which the dam structure has been provided. Meanwhile, the spread of a color mixture region is not prevented in the other space in which no dam structure has been provided. Instead, only a limited amount of an ink flows into the other space from the one space. Furthermore, the ink which has flowed into the other space spreads along adjacent banks. This confines the change in light-emission color from the originally specified color in the color mixture region in the other space to a negligible degree. Thus, according to the self-luminous display panel pertaining at least one embodiment, a display element failure caused by a defect portion of a bank is confined within a range that is defined by a dam structure formed in one of two adjacent spaces with between the bank having the defect portion is located.

Supplements

At least one embodiment above show a preferred specific example of the present disclosure. The numerical values, the shapes, the materials, the structural elements, the arrangement and connection status of the structural elements, the processes, the order of the processes, and so on described in at least one embodiment above are just examples, and do not intend to limit the present disclosure. Also, processes among the structural elements in at least one embodiment above, which are not described in the independent claims representing the most generic concept of the present disclosure, are explained as arbitrary structural elements of a more preferred embodiment.

Furthermore, the order of performing the above processes is exemplification for specifically describing the present disclosure, and the processes may be performed in an order different from the above one. Moreover, part of the above processes may be performed simultaneously (in parallel) with other process.

Also, the structural elements shown in the figures in at least one embodiment above are not necessarily exactly scaled for easy understanding of the present disclosure. Furthermore, the present disclosure is not limited by the description of at least one embodiment above, and may be appropriately modified without departing from the scope of the present disclosure.

Moreover, at least part of the functions of at least one embodiment above may be combined with each other.

Furthermore, the present disclosure also includes embodiments obtained through various types of modifications that could be conceived of by one skilled in the art to at least one embodiment above.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

The invention claimed is:

1. A method of manufacturing a self-luminous display panel, the method comprising:
   preparing a substrate;
   forming, above the substrate, banks that are each elongated and each extend in a column direction, the banks being arranged in a row direction with spaces therebetween;
   detecting a bank having a defect portion among the banks;
   determining, with respect to the detected bank having the defect portion, only one of two adjacent spaces as a repair target space, the two adjacent spaces each being located between the detected bank and a bank adjacent to the detected bank in the row direction;
   forming, in the repair target space, a dam structure within a predetermined distance from the defect portion, the dam structure at least partially surrounding the defect portion or being composed of a pair of dam elements disposed with the defect portion therebetween in the column direction; and
   forming light-emitting layers by applying inks to the spaces between the banks, the inks containing self-luminous materials.

2. The method of claim 1, wherein
the determining determines, as the repair target space, the one space in which a light-emitting layer emitting light at a shorter wavelength is to be formed than in the other space.

3. The method of claim 1, wherein
in the forming of the light-emitting layers, an ink that is applied to a region defined by the dam structure in the repair target space flows into the other space via the defect portion.

4. The method of claim 1, wherein
in the forming of the light-emitting layers, an ink that is applied to the other space flows into a region defined by the dam structure in the repair target space via the defect portion.

5. A self-luminous display panel comprising:
   a substrate;
   banks disposed above the substrate, the banks each being elongated and extending in a column direction and being arranged in a row direction with spaces therebetween; and
   light-emitting layers containing self-luminous materials, the light-emitting layers being formed by applying inks to the spaces between the banks, wherein
   at least one of the banks has a defect portion, and
   with respect to the bank having the defect portion, a dam structure is provided in only one of two adjacent spaces that are each located between the bank and a bank adjacent to the bank in the row direction, the dam structure being within a predetermined distance from the defect portion, and at least partially surrounding the defect portion or being composed of a pair of dam elements disposed with the defect portion therebetween in the column direction.

6. The self-luminous display panel of claim 5, wherein
the dam structure is provided in the one space in which a light-emitting layer emitting light at a shorter wavelength is formed than in the other space.

7. The self-luminous display panel of claim 5, wherein
the other space includes a self-luminous material that is contained in an ink applied to the one space.

8. The self-luminous display panel of claim 5, wherein
the one space includes a self-luminous material that is contained in an ink applied to the other space.

* * * * *